United States Patent
Lee et al.

(10) Patent No.: US 6,967,340 B2
(45) Date of Patent: Nov. 22, 2005

(54) ION BEAM IRRADIATION DEVICE AND OPERATING METHOD THEREOF

(75) Inventors: Yun Bok Lee, Seoul (KR); Yong Sung Ham, Anyang-si (KR)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/880,254

(22) Filed: Jun. 29, 2004

(65) Prior Publication Data

US 2005/0040346 A1    Feb. 24, 2005

(30) Foreign Application Priority Data

Aug. 19, 2003  (KR) ...................... 10-2003-0057390
Aug. 20, 2003  (KR) ...................... 10-2003-0057478
Aug. 21, 2003  (KR) ...................... 10-2003-0057750

(51) Int. Cl.[7] ......................................... G02F 1/1337
(52) U.S. Cl. ............................ 250/492.21; 250/491.1; 250/492.1; 250/492.2; 250/492.3; 349/123; 349/128; 349/134; 349/136; 436/30
(58) Field of Search ............................... 349/123–129, 349/132–136, 187; 250/491.1, 492.1–3, 492.21, 250/492.3; 428/1.1, 1.2, 1.25, 27, 29, 30

(56) References Cited

U.S. PATENT DOCUMENTS

| | | | | |
|---|---|---|---|---|
| 5,030,322 A | * | 7/1991 | Shimada et al. ............... 216/23 |
| 5,770,826 A | | 6/1998 | Chaudhari et al. | |
| 6,020,946 A | | 2/2000 | Callegari et al. | |
| 6,057,902 A | * | 5/2000 | Angelopoulos et al. ..... 349/129 |
| 6,061,114 A | | 5/2000 | Callegari et al. | |
| 6,061,115 A | | 5/2000 | Samant et al. | |
| 6,124,914 A | * | 9/2000 | Chaudhari et al. .......... 349/129 |
| 6,195,416 B1 | | 2/2001 | DeCaluwe et al. | |
| 6,248,606 B1 | * | 6/2001 | Ino et al. ....................... 438/30 |
| 6,300,628 B1 | * | 10/2001 | Fujii et al. ................... 250/309 |
| 6,313,896 B1 | * | 11/2001 | Samant et al. ............... 349/124 |
| 6,331,381 B1 | | 12/2001 | Chaudhari et al. | |
| 6,346,975 B2 | | 2/2002 | Chaudhari et al. | |
| 6,632,483 B1 | * | 10/2003 | Cesare Callegari et al. 427/526 |
| 6,641,704 B2 | * | 11/2003 | Someno ................. 204/192.12 |
| 6,654,089 B2 | * | 11/2003 | Chaudhari et al. .......... 349/124 |
| 6,660,341 B2 | * | 12/2003 | Andry et al. ................ 427/533 |
| 6,665,033 B2 | * | 12/2003 | Chaudhari et al. .......... 349/123 |
| 6,753,253 B1 | * | 6/2004 | Takahashi et al. ........... 438/676 |
| 6,820,508 B2 | * | 11/2004 | Lee .......................... 73/864.91 |
| 6,838,685 B1 | * | 1/2005 | Kodama et al. ........ 250/492.21 |
| 2002/0001057 A1 | * | 1/2002 | Chaudhari et al. .......... 349/124 |
| 2002/0135721 A1 | * | 9/2002 | Fijol .......................... 349/123 |

(Continued)

FOREIGN PATENT DOCUMENTS

JP  9-230351    9/1997
JP  09-230351  * 9/1997 ......... G02F 1/1337

Primary Examiner—John R. Lee
Assistant Examiner—Bernard E. Souw
(74) Attorney, Agent, or Firm—Brinks Hofer Gilson & Lione

(57) ABSTRACT

An ion beam irradiation device includes a vacuum chamber and a stage on which at least two substrates may be mounted such that each substrate has an inclination angle to a horizontal plane of the vacuum chamber. The stage moves in one direction. An ion gun provided in the vacuum chamber produces ion beams that irradiate the substrates. In a single pass through the vacuum chamber, the alignment layers disposed on multiple substrates may be aligned. The substrates can be aligned such that the ion beam irradiates multiple substrates simultaneously and/or such that the ion beam irradiates the multiple substrates sequentially.

53 Claims, 17 Drawing Sheets

U.S. PATENT DOCUMENTS

| | | | |
|---|---|---|---|
| 2002/0163612 A1 * | 11/2002 | Chaudhari et al. | 349/124 |
| 2003/0140691 A1 * | 7/2003 | Lee | 73/162 |
| 2004/0108067 A1 * | 6/2004 | Fischione et al. | 156/345.38 |
| 2004/0151911 A1 * | 8/2004 | Callegari et al. | 428/408 |
| 2004/0227883 A1 * | 11/2004 | Lee et al. | 349/129 |
| 2004/0247798 A1 * | 12/2004 | Ham et al. | 427/551 |

* cited by examiner

ION BEAM IRRADIATION DEVICE AND OPERATING METHOD THEREOF

This application claims the benefit of priority to Korean Patent Application No. 2003-57390, filed in Korea on Aug. 19, 2003, Korean Patent Application No. 2003-57478, filed in Korea on Aug. 20, 2003, and Korean Patent Application No. 2003-57750, filed in Korea on Aug. 21, 2003, which are hereby incorporated by reference for all purposes as if fully set forth herein.

BACKGROUND OF THE INVENTION

1. Field of the Invention

The present invention relates to an ion beam irradiation device, which irradiates an ion beam onto an alignment layer for alignment of liquid crystal molecules during fabrication of a liquid crystal display, and a method of operating the same.

2. Description of the Related Art

In general, cathode ray tubes (CRT) have been widely used as display devices for displaying image information on screens. However, CRTs are problematic as they have large volumes and are heavy compared with their display areas.

Today, display devices are being used in desktop computers, notebook computers, wireless terminals such as cellular telephones and PDAs, automotive instrument boards, and electronic display boards. With the development of information communication technology, with the increasing ability to transmit high-capacity image information, the importance of a display device capable of processing such high-capacity image information is also increasing.

It is desirable for next generation display devices to be slim and lightweight, have a high brightness, a large screen size, low power consumption and low price. Liquid crystal displays (LCD) are accordingly gaining popularity as a flat panel displays capable of meeting the above requirements.

The LCD exhibits superior resolution compared with other flat panel displays and has rapid response speed. The response speed is comparable to that of the CRT.

The LCD uses the optical anisotropy and polarization of liquid crystals. Liquid crystal molecules with a thin and long structure have directionality and polarization. Hence, by applying an electric and magnetic field to the liquid crystal molecules, it is possible to control the alignment direction of the liquid crystal molecules.

To this end, by arbitrarily controlling the alignment direction of the liquid crystal molecules, the alignment of the liquid crystal molecules is varied and polarized light is modulated by the optical anisotropy of the liquid crystal, thereby displaying image information.

FIG. 1 is a plane view illustrating a pixel structure of a related art LCD.

Referring to FIG. 1, the LCD 100 includes a lower substrate 101, an upper substrate 102, and a liquid crystal layer interposed between the lower substrate 101 and the upper substrate 102.

The lower substrate 101 includes a first transparent substrate 111, a gate electrode 121 formed on the first transparent substrate 111, and a gate insulating layer 130 formed of silicon nitride (SiNx) or silicon oxide (SiOx) on the gate electrode 121 and the first transparent substrate 111.

An amorphous silicon active layer 141 is formed on the gate insulating layer 130, and an impurity-doped ohmic contact layer 151, 152 is formed on the active layer 141.

Source and drain electrodes 161 and 162 are formed on the ohmic contact layer 151, 152. The source and drain electrodes 161 and 162 form a thin film transistor together with the gate electrode 121.

A passivation layer 170 is formed on a resultant structure including the source and drain electrodes 161 and 162. The passivation layer 170 is formed of silicon nitride (SiNx), silicon oxide (SiOx) or organic insulator. A contact hole for electrical connection of the drain electrode 162 is formed in the passivation layer 170. A transparent conductive pixel electrode 181 is formed on pixel region of the passivation layer 170 and is electrically connected to the drain electrode 162 through the contact hole 171.

A first alignment layer 191 is formed on the pixel electrode 181. The first alignment layer 191 is formed of polyimide and is processed such that a surface thereof has a predetermined direction.

The gate electrode 121 is connected to a gate line, and the source electrode is connected to a data line. The gate line and the data line cross each other, thereby defining a pixel region.

The upper substrate 102 is disposed above the lower substrate 101. The upper and lower substrates are spaced apart by a predetermined interval.

A black matrix (BM) layer 120 is formed on the second transparent substrate 110. The BM layer 120 is formed at a portion corresponding to the thin film transistor formed on the first substrate 111 to prevent light from being transmitted in a region other than the pixel region.

A color filter layer 131 having red (R), green (G) and blue (B) color filters is formed beneath the black matrix layer 120. The red (R), green (G) and blue (B) color filters are sequentially repeated, and one color corresponds to a unit pixel region.

A transparent conductive common electrode 140 is formed beneath the color filter layer 131. A second alignment layer 150 is formed beneath the common electrode 140. The second alignment layer 150 is formed of polyimide and is processed such that a surface thereof has a predetermined direction.

The liquid crystal layer 190 is interposed between the first alignment layer 191 and the second alignment layer 150. The initial alignment state of liquid crystal molecules of the liquid crystal layer 190 is determined by the alignment direction of the first and second alignment layers 191 and 150.

Hereinafter, a process for forming the first and second alignment layers 191 and 150, which determine the initial alignment direction of the liquid crystal molecules of the liquid crystal layer, will be described in more detail.

First, the alignment layers are formed by coating a thin polymer film and alignment-processing the coated polymer film. A polyimide-based organic material is generally used as the alignment layer, and a rubbing method is used for aligning the alignment layer.

In the rubbing method, the alignment layer is formed by coating a polyimide-based organic film on a substrate, eliminating a solvent at a temperature of 60–80° C., curing the coated polyimide-based organic film at a temperature of 80–200° C., and rubbing the cured polyimide-based organic film using a rubbing cloth of velvet in a constant direction.

The rubbing method is easy and provides a stable alignment. Accordingly the rubbing method is amenable for use in mass production.

However, the rubbing method is problematic for a number of reasons; since the rubbing method is performed by directly contacting the alignment layer with the rubbing cloth, cell contamination due to particles being transferred from the rubbing cloth as well as fracture of TFT due to static electricity may occur. The rubbing method also requires an additional cleaning after the rubbing. Further, when the rubbing method is used to produce large screens (over about 27 inches), the alignment uniformity is severely degraded, thereby reducing the production yield of the LCDs.

To improve the drawbacks of the rubbing process, non-rubbing techniques that do not use such a mechanical rubbing have been proposed.

There are various non-rubbing methods, for example, a method using Langmuir-Blodgett (LB) film, an optical alignment method using UV irradiation, a method using a micro-groove formed by a photolithography process, a method using ion beam irradiation and the like.

The method using the ion beam has advantages in that it can solve the drawbacks of the mechanical rubbing method, can use old materials for the alignment layer, and can be applied to a large sized screen.

FIG. 2 is a schematic view of a related art ion beam irradiation device used for forming an alignment layer.

The related art ion beam irradiation device 260 is divided into three functional regions. Injection gas is ionized into ions and electrons form plasma in the first region 203. The ions are converted into a beam and are accelerated in the second region 206. The third region 211, or the ion beam irradiation region, ranges from a discharge point of the accelerated ion beam 210 to a substrate 220.

In the first region 203, the injected gas is ionized into ions. The ionized ions are then extracted, accelerated and irradiated onto the substrate 220. The ion beam irradiation device 260 is designed to irradiate the ion beam 210 onto the substrate 220 fixed to a holder 221 of a vacuum chamber 240.

The ion beam irradiation device 260 has an ion beam source 200 including a cathode 201, an anode 202, an ion beam extracting medium 204, and an ion beam accelerating medium 205. Also, the ion beam irradiation device 260 is further provided with the vacuum chamber allowing the ion beam generated by the ion beam source 200 to be moved in a straight line to the substrate 220 and irradiated onto the substrate 220. The ion beam irradiation device 260 is further provided with the holder 221 for fixing the substrate 220 such that the substrate maintains a predetermined angle within the vacuum chamber 240.

Although not shown in the drawings, the ion beam irradiation device 260 may be further provided, between the ion beam source 200 and the substrate 220, with a shutter so as to control when the ion beam 210 arrives on the substrate 220.

The ion beam source 200 generates ions and the ion beams 210. In other words, the injected gas is ionized by a voltage difference between the cathode 201 and the anode 202, thereby generating plasma including ions and electrons. The generated ions pass through orifices of the ion beam extracting medium 204 by an extracting electrode and are extracted as the ion beam.

The ion beam 210 extracted from the discharged plasma is accelerated by interaction of an electric field applied to the ion beam accelerating medium 205 and is then irradiated onto the substrate 220 at a predetermined angle.

The substrate 220 is disposed inclined with respect to the ion beam 210, thereby setting a desired pretilt angle on the alignment layer coated on the substrate 220.

Thus, the ion beam 210 generated by the ion beam source 200 is extracted in a normal direction of the ion beam source 200 and is then irradiated onto the substrate inclined at the predetermined angle $\theta 1$. The pretilt angle is determined by an irradiation angle $\theta 2$ of the ion beam 210. As shown, the irradiation angle $\theta 2$ is equal to the inclined angle $\theta 1$.

The irradiation angle $\theta 2$ represents an angle between the irradiation direction of the ion beam 210 and the normal direction of the substrate 220. The relation between the irradiation angle $\theta 2$ of the ion beam and the pretilt angle is shown in FIG. 3.

Referring to FIG. 3, the pretilt angle exhibits different characteristics depending on the irradiation angle of the ion beam. When the irradiation angle is between 40 degrees and 60 degrees, a maximum pretilt angle is obtained. In a range other than the above range, the pretilt angle is below 5 degrees.

Accordingly, to obtain a uniform desired pretilt angle in LCDs, the ion beam must irradiate the entire surface of the alignment layer of the substrate at the same energy and at a proper irradiation angle.

However, the related art ion beam irradiation device is not amenable to mass production, at least because the pretilt angle has to be reset each time the irradiated substrate is removed and a new substrate added. This increases the time needed to form the pretilt angle, resulting in a low throughput.

SUMMARY OF THE INVENTION

Aspects of the present invention provide an ion beam irradiation device and fabrication method thereof that can perform alignment of a plurality of substrates at the same time.

In different aspects of the ion beam irradiation device, as embodied and broadly described herein, comprise: a vacuum chamber, a movable stage adapted to mount at least two substrates such that the substrates are disposed in the vacuum chamber with an inclination angle to a vertical plane of the vacuum chamber, and an ion gun provided in the vacuum chamber from which an ion beam is emitted.

Methods of operating an ion beam irradiation device comprise arranging at least two substrates in a vacuum chamber such that the substrates are inclined at an angle with respect to a horizontal plane, irradiating an ion beam onto the substrates while the substrates are moving.

In another aspect, a method of operating the ion beam irradiation device comprises the ion beam of the ion gun satisfying $(Lg \times I \times T)/Ls \leq 1.6 \times 10^{-2}$ where I is a current intensity of the ion beam, T is an irradiation time on the substrate, Lg is a length of a short side of the ion beam irradiation outlet, and Ls is a length of the substrate in the moving direction.

In another aspect, the method comprises controlling a process condition such that the ion beam of the ion gun satisfies $1.6 \times 10^{-4} \leq I \times T \times Sg/Ss \leq 1.6 \times 10^{-2}$ where I is a current intensity of the ion beam, T is an irradiation time on the substrate, Sg is an area of the ion beam irradiated by the ion gun, and Ss is an area of the substrate.

In another aspect, the method comprises controlling a process condition such that the dose of ions of ion beam is between $1.0 \times 10^{15}$ (EA/cm$^2$) and $1.0 \times 10^{17}$ (EA/cm$^2$).

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
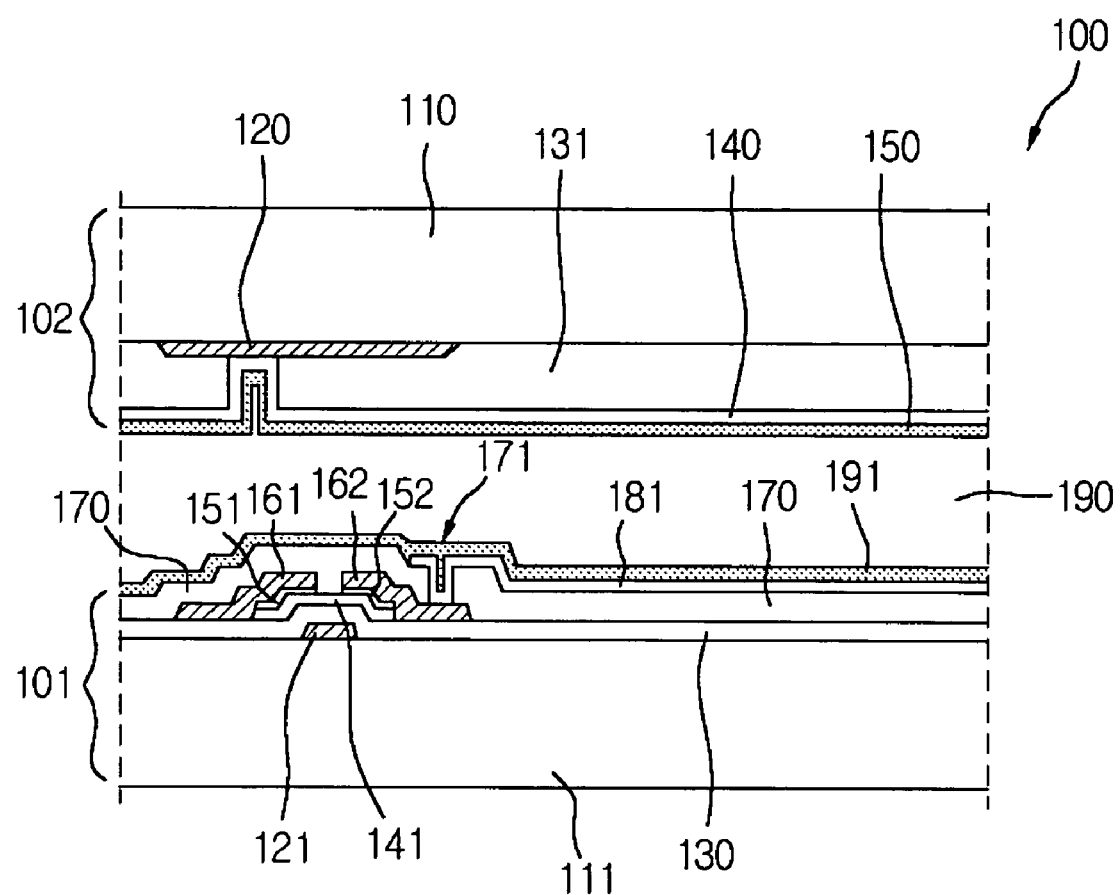
FIG. 1 is a partial sectional view of a related art LCD.
Figure 2:
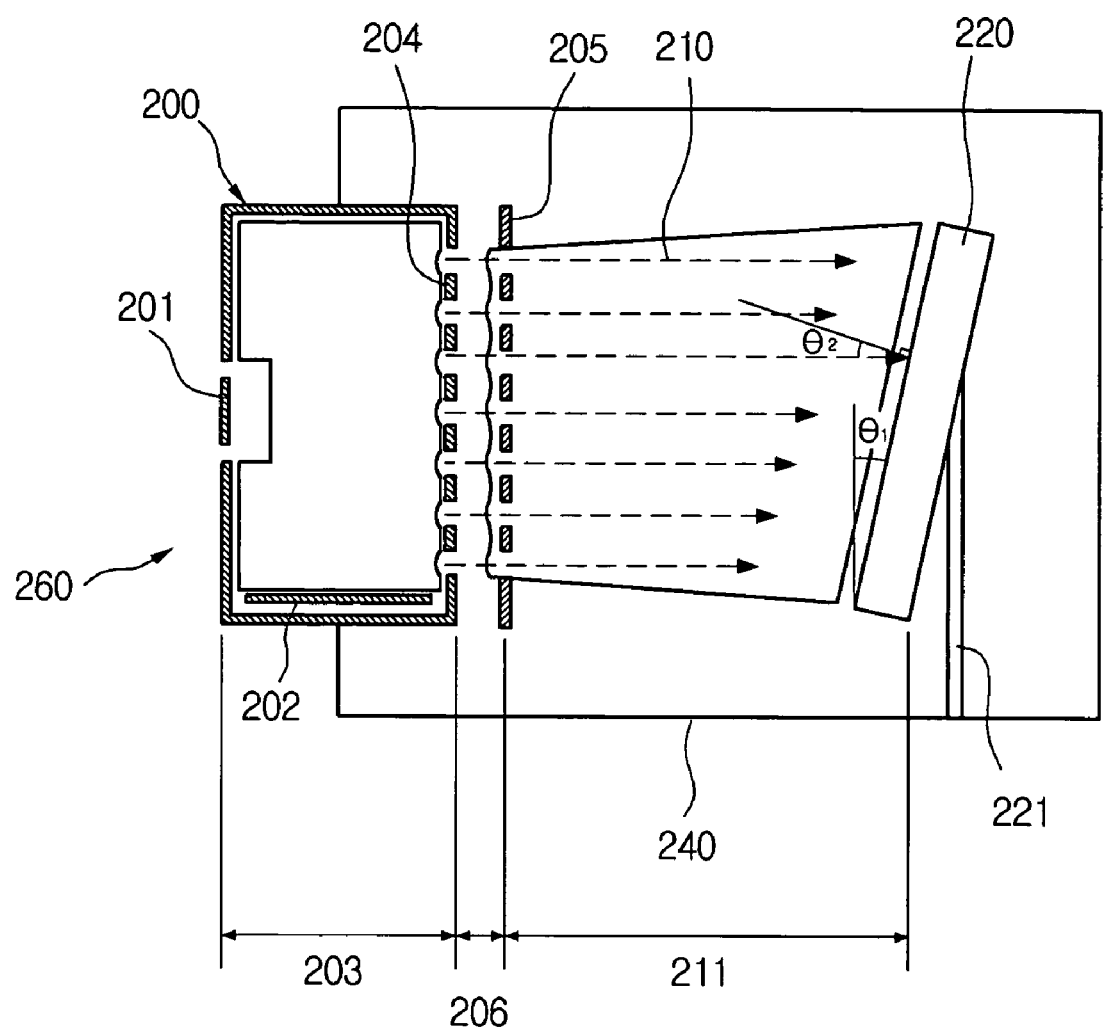
FIG. 2 is a schematic view of a related art ion beam irradiation device used for forming an alignment layer.
Figure 3:
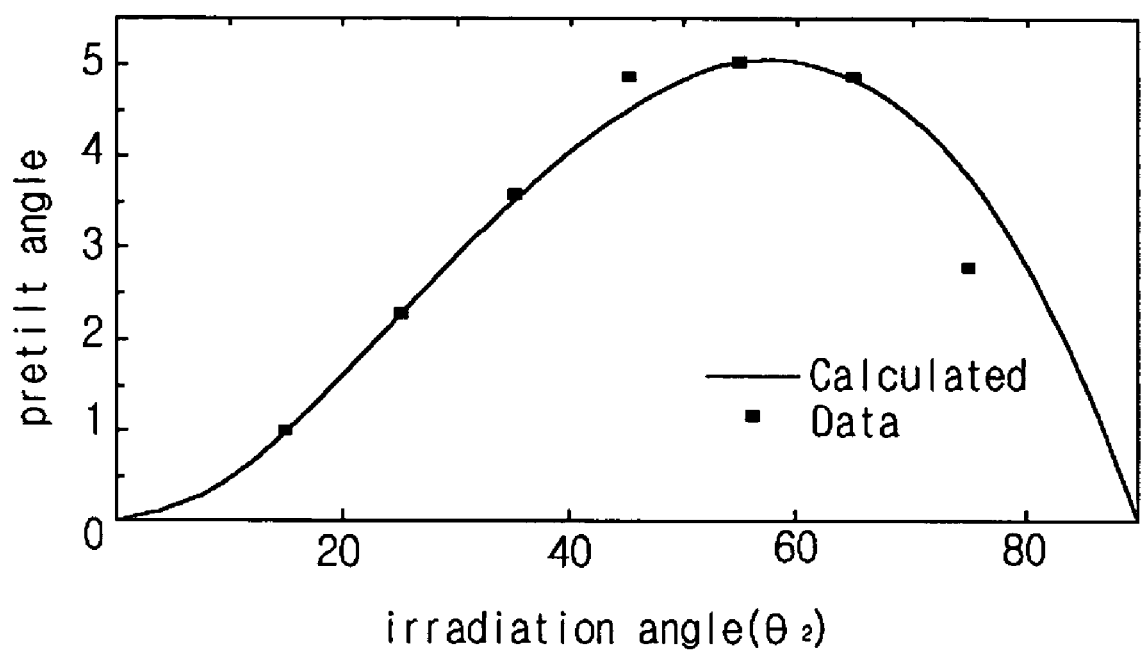
FIG. 3 is a graph illustrating relation between irradiation angle θ2 of ion beam and pretilt angle in the related art ion beam irradiation device.

Reference will now be made in detail to various embodiments of an ion beam irradiation device that can align an alignment layer of two or more substrates, construction and operations of which are illustrated in the accompanying drawings.

The embodiments shown in the figures have certain common features. Each ion beam irradiation device is designed such that the substrates can be moved in one direction and an ion beam can irradiate the entire surface of the substrates.

Each ion beam irradiation device includes an ion beam source for ionizing injected gas, accelerating the ions, and projecting the accelerated ions toward the substrates in an ion beam. The ion beam source thus includes a plasma forming part, which decomposes the injected gas into ions and electrons to form a plasma, and an ion gun for accelerating and extracting the ion beam formed by the plasma forming part toward the substrate using an applied electric field.

The ion beam irradiation device includes a vacuum chamber through which the substrates move in a straight line to be irradiated by the ion beam. The ion beam irradiation device includes a stage on which the substrates are mounted. The substrates are fixed to the stage and are inclined at an angle relative to the ion beam such that a desired pretilt angle is obtained. The ion beam then irradiates the substrate. The stage moves through the portion of the vacuum chamber in which the substrates are irradiated at a predetermined constant velocity in one direction.

Valves of the ion beam irradiation device allow the gas in the vacuum chamber to be discharged after irradiation of the alignment layer is completed. The valves also allow the stage to be transferred from the exterior of the vacuum chamber to the interior and vice-versa.

The alignment process can be divided into three operations. In the first operation, the stage on which the substrates are mounted is loaded into the ion beam irradiation device. In the second operation, after the stage is loaded into the ion beam irradiation device, the ion beam irradiates the substrates. In the third operation, after the ion beam has irradiated the substrates, the substrates are unloaded.

In more detail, when an extracting valve of the ion beam irradiation device is opened, the stage is transferred into the vacuum chamber and is set. The substrates and ion beam are set such that the desired angle exists between them. The stage then moves at a constant velocity through the irradiation area of the vacuum chamber (that is the area in which the substrates are exposed to the ion beam) such that the ion beams then irradiate the alignment layers formed on the substrates to align the alignment layer in the desired alignment direction and desired pretilt angle. For uniform alignment, it is desirable that the substrates move at a constant velocity and the ion gun is designed to irradiate the alignment layers using an ion beam having a constant dose.

When alignment of the alignment layers is completed, the extracting valve is opened and the stage is unloaded out of the vacuum chamber.

The substrate is coated with an alignment layer formed of, for example, an organic material such as polyimide, or an inorganic material such as $SiO_2$, $SiC$, $Si_3N_4$, $Al_2O_3$, $CeO_2$, $SnO_2$, glass, $ZnTiO_2$, or diamond-like carbon (DLC). If the alignment layer is formed of an organic material, the organic material has main chains and side chains in its chemical structure. The main chain functions to align the liquid crystal molecules in one direction, and the side chain functions to form the pretilt angle. In particular, the side chain reacts during the ion beam irradiation and is cut away at a portion thereof such that the liquid crystal molecules are aligned with directionality.

First Embodiment

Figure 4:
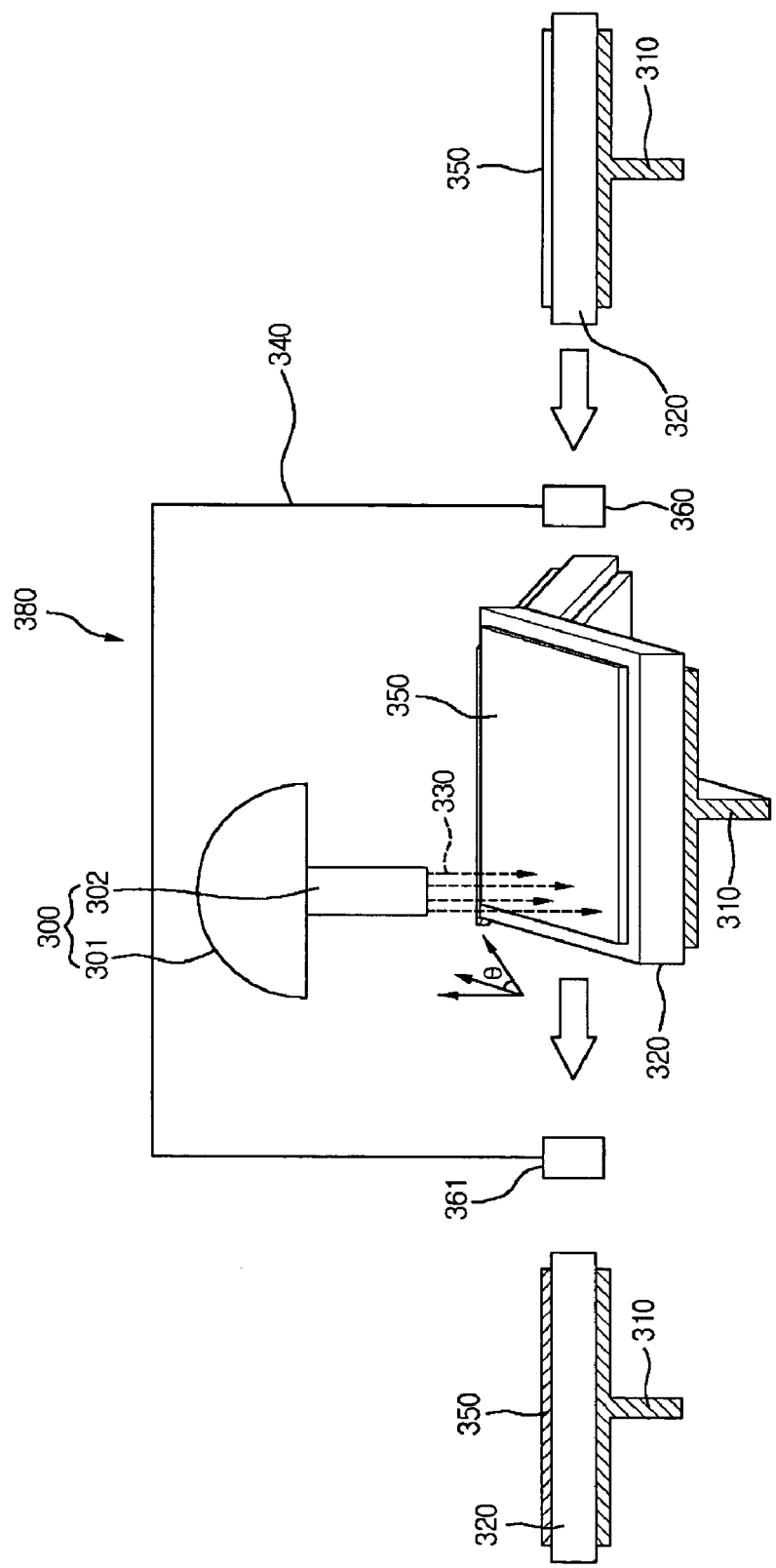
FIG. 4 is a schematic view of an ion beam irradiation device according to a first embodiment of the present invention.
Figure 5:
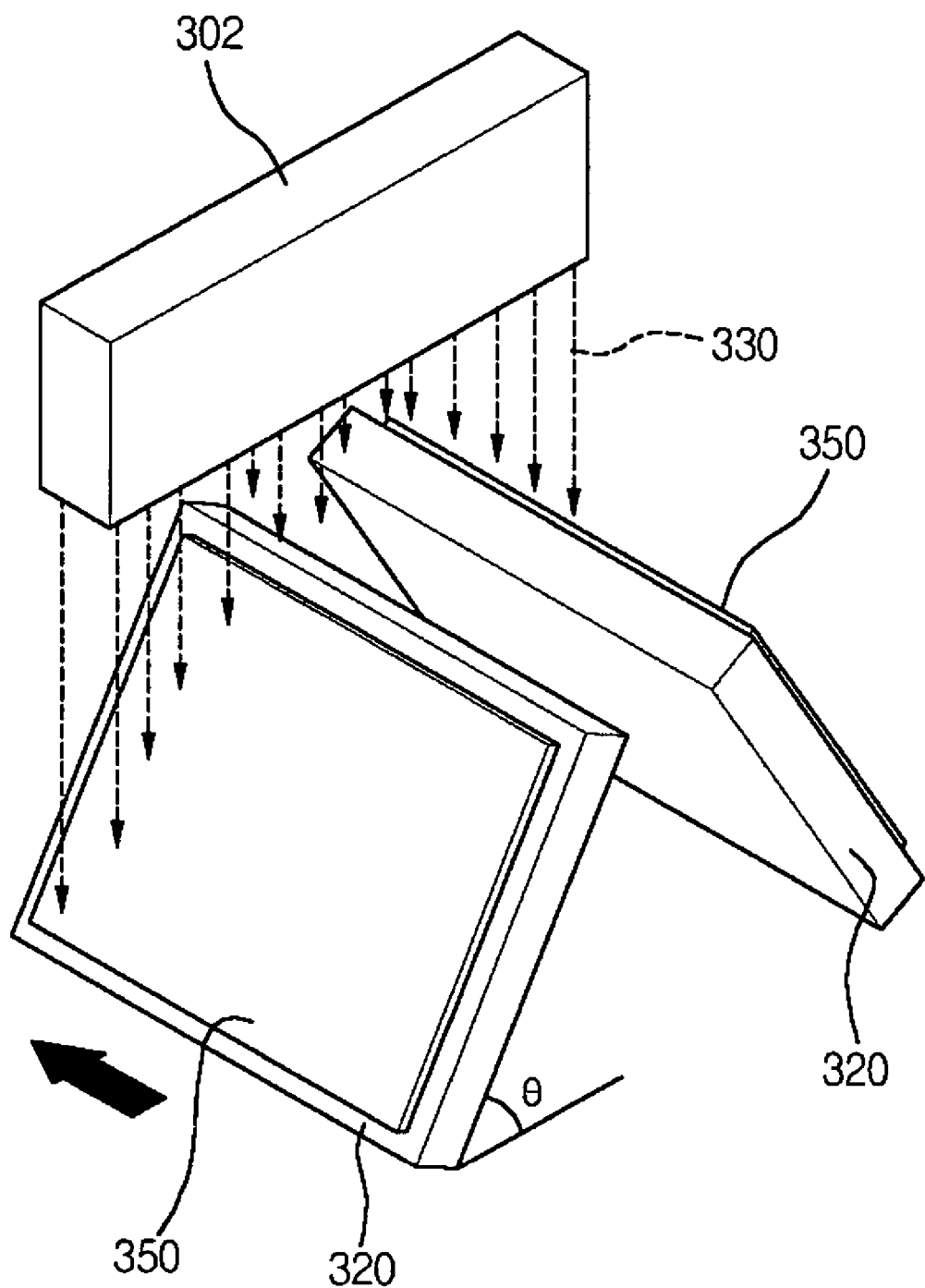
FIG. 5 is a partial perspective view of the ion beam irradiation device of FIG. 4.

FIG. 4 is a schematic view of an ion beam irradiation device according to a first embodiment. FIG. 5 is a partial perspective view of the ion beam irradiation device of FIG. 4, and shows the alignment of the substrates.

Referring to FIGS. 4 and 5, the ion beam irradiation device 380 includes an ion beam source 300 which produces the ion beam 330, a vacuum chamber 340, a stage 310 on which the substrates 320 are mounted and valves 360 and 361. The ion beam source 300 includes a plasma forming part 301 and an ion gun 302.

The substrates 320 are coated with an alignment layer 350, mounted to the stage 310 and inclined by an angle such that a desired pretilt angle is obtained. The substrate 320 can move in one direction. The substrate 320 is irradiated by the ion beam 330 at an angle with respect to the substrate 320.

More specifically, in this embodiment, the substrates 320 are arranged parallel to the moving direction. The substrates 320 are transferred inside the vacuum chamber 340 such that the substrates 320 are inclined at a predetermined angle θ are inclined at an angle θ to each other and are symmetric around a vertical axis along which the ions will irradiate the substrates 320. Once loaded, the stage 310 moves from its loading position through the vacuum chamber 340 to an irradiation position. Having reached the irradiation position, the stage 310 then moves at a constant velocity through the ion beam 330 such that the bar-type ion gun 302 simultaneously irradiates the alignment layers 350 on the substrates 320 with the ion beam 330, thereby aligning the alignment layer.

Thus, in the ion beam irradiation apparatus 380, it is unnecessary to double the size of the ion gun 302 to form two substrates simultaneously because the substrates 320 are inclined at a predetermined angle during the alignment process, thereby decreasing the surface area of the substrates.

Second Embodiment

Figure 6:
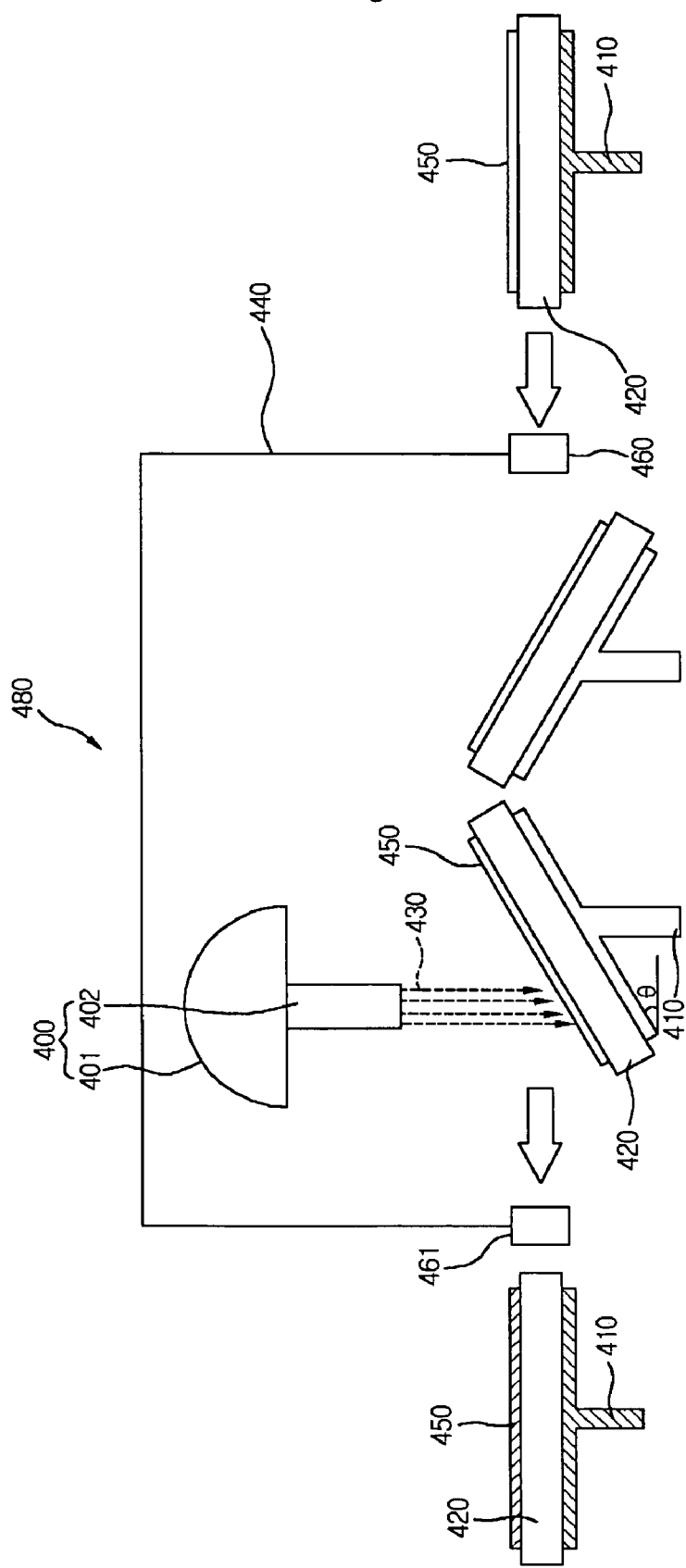
FIG. 6 is a schematic view of an ion beam irradiation device according to a second embodiment of the present invention.
Figure 7:
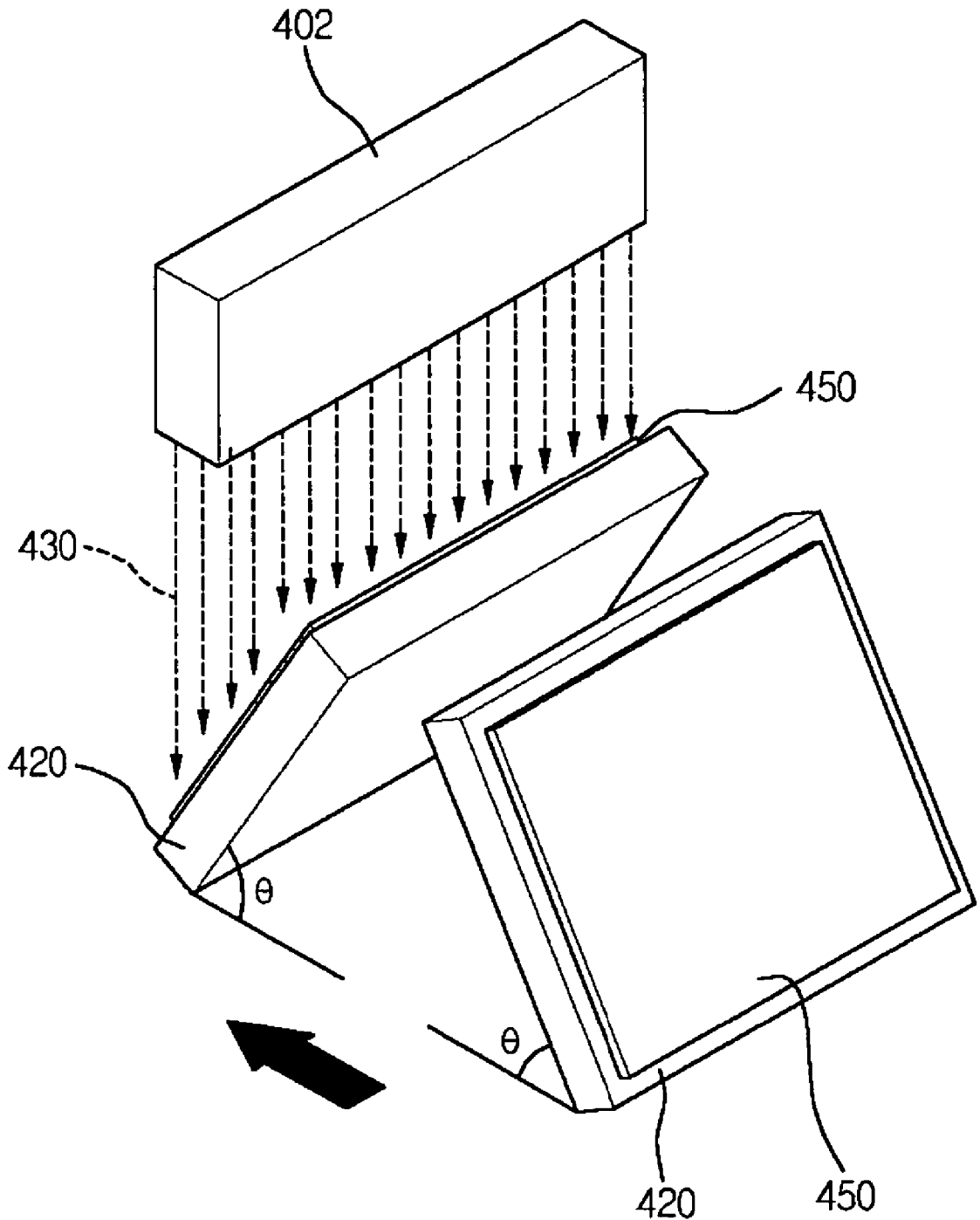
FIG. 7 is a schematic partial perspective view of the ion beam irradiation device of FIG. 6.

FIG. 6 is a schematic view of an ion beam irradiation device according to a second embodiment of the present invention. FIG. 7 is a partial perspective view of the ion beam irradiation device of FIG. 6, and shows alignment of the substrates.

The ion beam irradiation device 480 of the second embodiment is different from the ion beam irradiation device 380 of the first embodiment in that the substrates 420 are arranged differently from the substrates 320 of the first embodiment.

The ion beam irradiation device 480 includes an ion beam source 400 generating an ion beam 430 using a plasma forming part 401 and an ion gun 402, a vacuum chamber 440, a stage 410 on which the substrates 420 coated with alignment layers 450 are mounted, and valves 460 and 461.

The substrates 420 are fixed to the stage 410 and are inclined by an angle such that a desired pretilt angle is obtained. The moving substrates 420 fixed on the stage 410 are arranged perpendicular (which is herein used interchangeably with substantially perpendicular or within a few degrees of perpendicular) to the moving direction thereof, unlike the moving substrates 320 which were arranged parallel to the moving direction. In other words, the substrates 420 are arranged in series (i.e. such that the ion beam will irradiate the substrates sequentially rather than in parallel as in the embodiment shown in FIGS. 4 and 5). The substrates 420, which are inclined at an angle θ such that the substrates are symmetric to an axis perpendicular to the moving direction, then move within the vacuum chamber 440 at a constant velocity while the alignment layers 450 are irradiated by the ion beam 430. The bar-type ion gun 402 irradiates the entire surface of the alignment layer 450 with the ion beam 430 serially, thereby aligning the alignment layer 450. Accordingly, each alignment layer 450 can form a desired pretilt angle.

Third Embodiment

Figure 8:
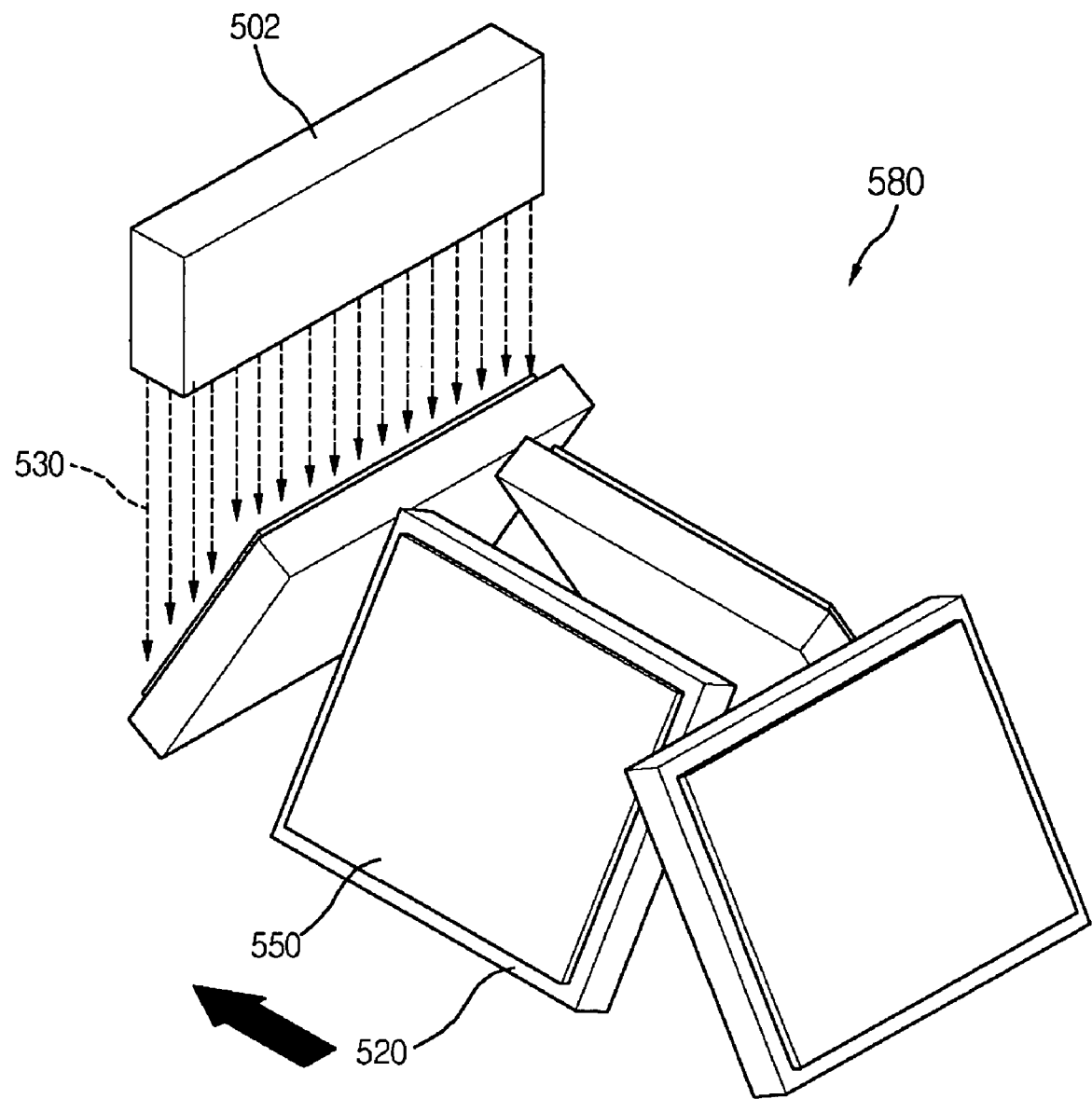
FIG. 8 is a schematic view illustrating an alignment process of a substrate in an ion beam irradiation device according to a third embodiment of the present invention.

FIG. 8 is a schematic view of an ion beam irradiation device according to a third embodiment of the present invention.

The ion beam irradiation device 580 of the third embodiment is different from the ion beam irradiation devices 380 and 480 of the first and second embodiments in that the moving substrates 520 are arranged differently from the moving substrates 320 and 420 of the first and second embodiments when the ion beam is irradiated.

As shown in FIG. 8, four substrates 520 are transferred into the ion beam irradiation device 580. The four substrates 520 consist of two substrates arranged parallel to the moving direction, and two substrates arranged perpendicular to (or in series with respect to) the moving direction. Thus, the embodiment shown in FIG. 8 is similar to a combination of the previous embodiments.

The substrates 520 are arranged inclined at an angle inside the ion beam irradiation device 580 to obtain a desired alignment characteristic.

The two substrates 520 arranged in parallel to the moving direction are inclined to be symmetric to an axis parallel to the moving direction, whereas the two substrates 520 arranged in series with respect to the moving direction are inclined symmetric to an axis perpendicular to the moving direction.

The arrangement of the substrates 520 may be modified within the range in which the ion beam irradiates all of the substrates 520.

The substrates 520 are mounted on the stage and move together in one direction at a constant velocity inside the area of irradiation. Hence, alignment of the entire surface of the alignment layer 550 of each of the four substrates 520 is performed at the same time by a single ion beam irradiation.

More specifically, of the four substrates 520 transferred into the vacuum chamber, two of the substrates 520 arranged parallel to the moving direction are inclined to be symmetric to an axis parallel to the moving direction, and the other two substrates 520 arranged in series with respect to the moving direction are inclined to be symmetric to an axis perpendicular to the moving direction. All of the substrates 520 mounted on the stage move in one direction together. Hence, alignment of the alignment layers of the four substrates 520 is performed at the same time by a single ion beam irradiation using the bar-type ion gun 502.

To align two or more substrates using only one ion beam irradiation, the shape of the ion gun may be modified. Hereinafter, an ion beam irradiation device with an improved ion gun structure and operating method thereof will be described.

Fourth Embodiment

Figure 9:
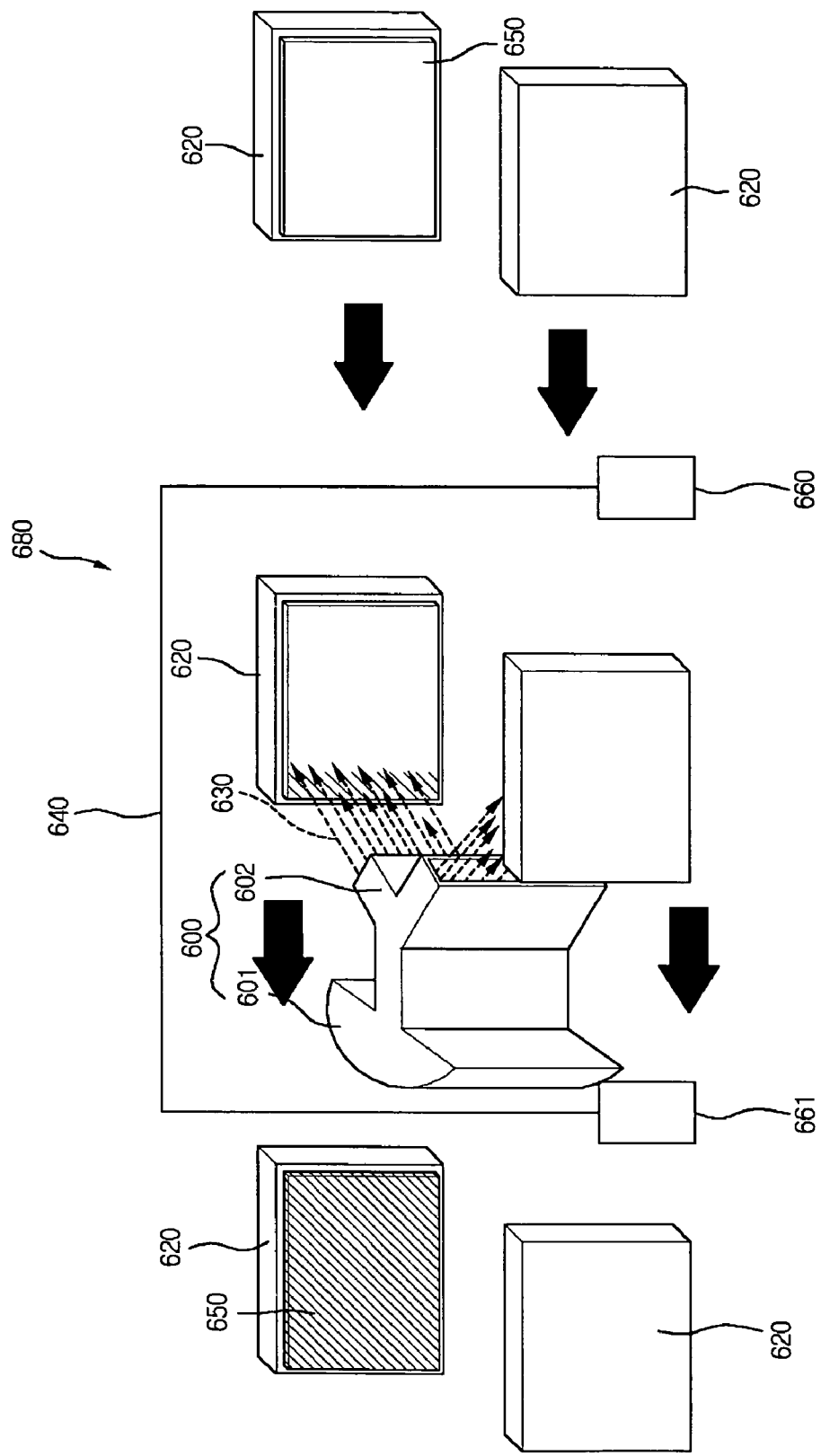
FIG. 9 is a schematic view of an ion beam irradiation device according to a fourth embodiment of the present invention.
Figure 10:
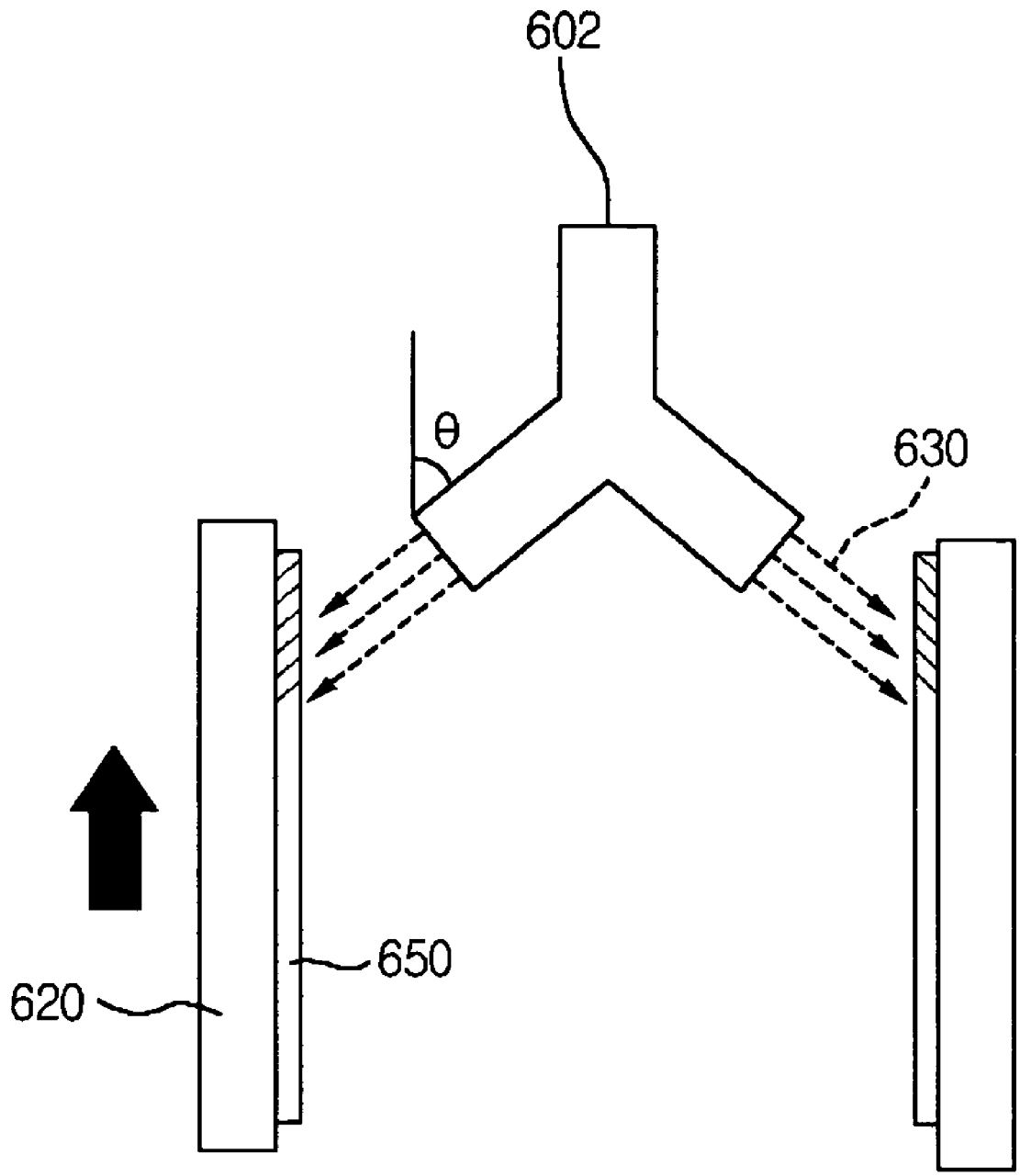
FIG. 10 is a schematic partial perspective view of the ion beam irradiation device of FIG. 9.

FIG. 9 is a schematic view of an ion beam irradiation device according to a fourth embodiment of the present invention. FIG. 10 is a partial sectional view of the ion beam irradiation device of FIG. 9, and shows the alignment of the substrates.

In the ion beam irradiation device 680 according to the fourth embodiment of the present invention, an ion beam 630 irradiates an entire surface of each of substrates 620 as the substrates 620 move in one direction, as shown in FIG. 9.

The ion beam irradiation device 680 includes an ion beam source 600 generating ion beams 630 using a plasma forming part 601 and an ion gun 602, a vacuum chamber 640, a stage (not shown) on which the substrates 620 containing the alignment layers 650 are mounted, and valves 660 and 661.

In this embodiment, two substrates 620 parallel to each other are transferred into the vacuum chamber 640 and move in one direction. Accordingly, alignment of an alignment layer 650 of each of the two substrates 620 is performed by ion beams 630 extracted in both directions by an ion gun 602 disposed between the two substrates 620.

The ion gun 602 is inclined at an angle θ with respect to a moving direction of the substrates 620 such that the ion beams 630 are extracted at an angle. The ion beams extracted by the ion gun 602 irradiate the alignment layers 650 of the two substrates 620, thereby determining the pretilt angle of liquid crystal molecules.

The substrates 620 may be arranged parallel to upper and lower sides of the ion gun 602, or left and right sides of the ion gun 602 with the ion gun 602 interposed therebetween.

The substrates 620 are mounted and may be inclined at an angle on the stage inside the vacuum chamber 640 such that the alignment layers have a desired pretilt angle. Accordingly, the ion beam 630 extracted from the ion gun irradiates the substrates 620 at a predetermined angle. Thus, by controlling an angle of the substrates 620 fixed on the stage, it is possible to set the desired pretilt angle.

The substrates 620 are mounted on the stage and the fixed substrates 620 are moved into the vacuum chamber 640 and set. The substrates 620 face each other and are disposed in parallel to each other. The substrates 620 also move parallel to each other with the ion gun 602 interposed between the two substrates 620. The substrates 620 move at a constant velocity within the irradiation area. The ion gun 602 interposed between the two substrates 620 has two ion beam irradiating outlet branches, which are symmetric to the moving direction, and produces ion beams through the two ion beam irradiating outlet branches. The ion beam irradiating outlet branches are inclined by a predetermined angle with respect to the axis parallel to the moving direction and thus the outlet branches irradiate the substrates 620 with ion beams at an angle, thereby aligning the alignment layers 650 formed on the substrates 620.

Accordingly, the alignment layer 650 can form a desired pretilt angle.

The ion beams 630 extracted at an angle by the ion gun 602 irradiate the substrates 620, which are transferred in parallel to each other as shown in FIG. 10.

Since the substrates 620 move in one direction, the entire surface of the alignment layers of the two substrates 620 are alignment-treated by the ion beams 630 extracted by the ion beam irradiating outlet branches of the ion gun 602.

Fifth Embodiment

Figure 11:
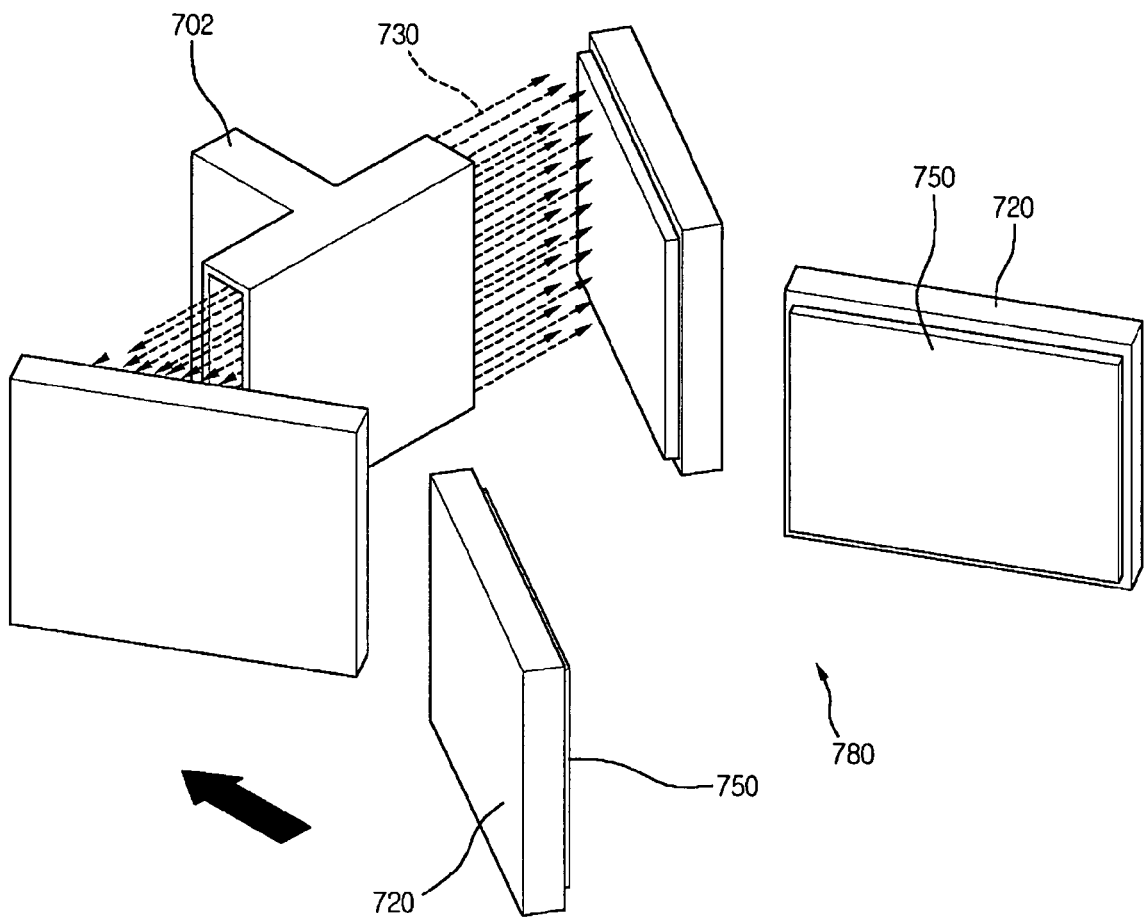
FIG. 11 a schematic view of an ion beam irradiation device according to a fifth embodiment of the present invention.
Figure 12:
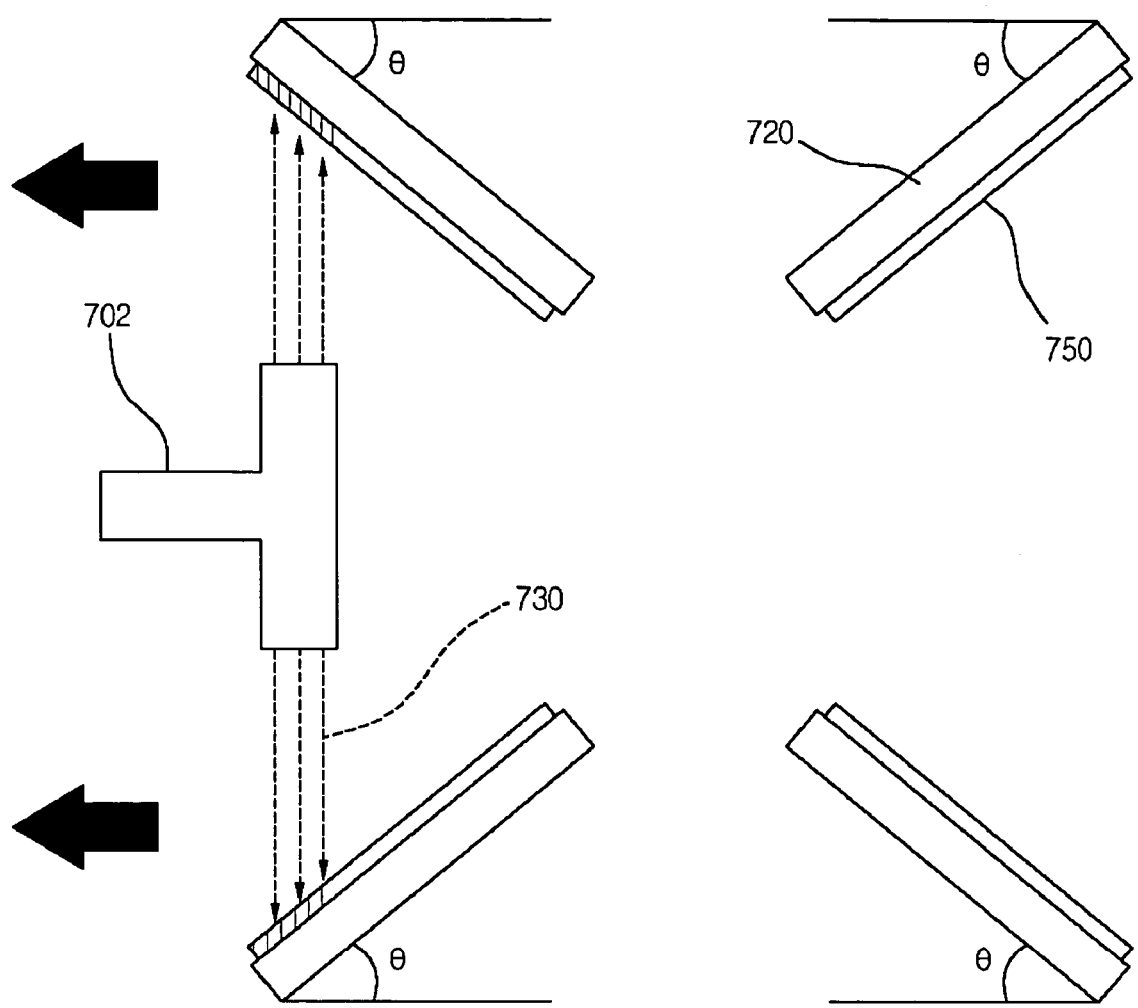
FIG. 12 is a schematic partial perspective view of the ion beam irradiation device of FIG. 11.

FIG. 11 is a schematic view of an ion beam irradiation device according to a fifth embodiment of the present invention. FIG. 12 is a partial plane view of the ion beam irradiation device of FIG. 11, and shows the alignment of the substrates.

In the ion beam irradiation device 780, an ion beam 730 irradiates an entire surface of each of substrates 720 as the substrates 720 move in one direction, as shown in FIG. 11.

The ion beam irradiation device 780 is similar to the fourth embodiment. The ion beam irradiation device 780 includes an ion gun 702, which accelerates an ion beam 730 and extracts the accelerated ion beam towards the substrates 720. The ion gun 702 has ion beam irradiating outlet branches for irradiating the ion beams 730 in directions perpendicular to a moving direction of the substrates 720.

In this embodiment, four substrates 720 are irradiated in one pass. The substrates 720 are mounted on a stage (not shown) and inclined at a predetermined angle θ on the stage in a vacuum chamber (not shown) such that the alignment layers 750 can obtain a desired pretilt angle, and can move in the direction shown in the figures. Accordingly, the extracted ion beams 730 irradiate the alignment layers 750 with a predetermined angle with respect to the substrates 720.

The substrates 720 are arranged into two pairs of substrates. The pairs of substrates 720 move in the moving direction with respect to the ion gun 702 disposed therebetween. The pairs of substrates 720 are inclined at a predetermined angle to be symmetric in the moving direction and in a direction perpendicular to the moving direction. In other words, the substrates 720 are symmetric around a center of the substrates 720 and each substrate 720 is inclined at the predetermined angle with respect to the outlet branches of the ion gun 702. Accordingly, as the substrates 720 move, the ion beams irradiate the substrates 720, thereby aligning the alignment layers formed on the substrates 720.

The ion beams 730 extracted from the bar-type ion gun 702 irradiate the pairs of substrates 720 as shown in FIG. 12, so that the entire surface of the alignment layers of the two pairs of substrates 720 are alignment-treated by the ion beams 730.

Sixth Embodiment

Figure 13:
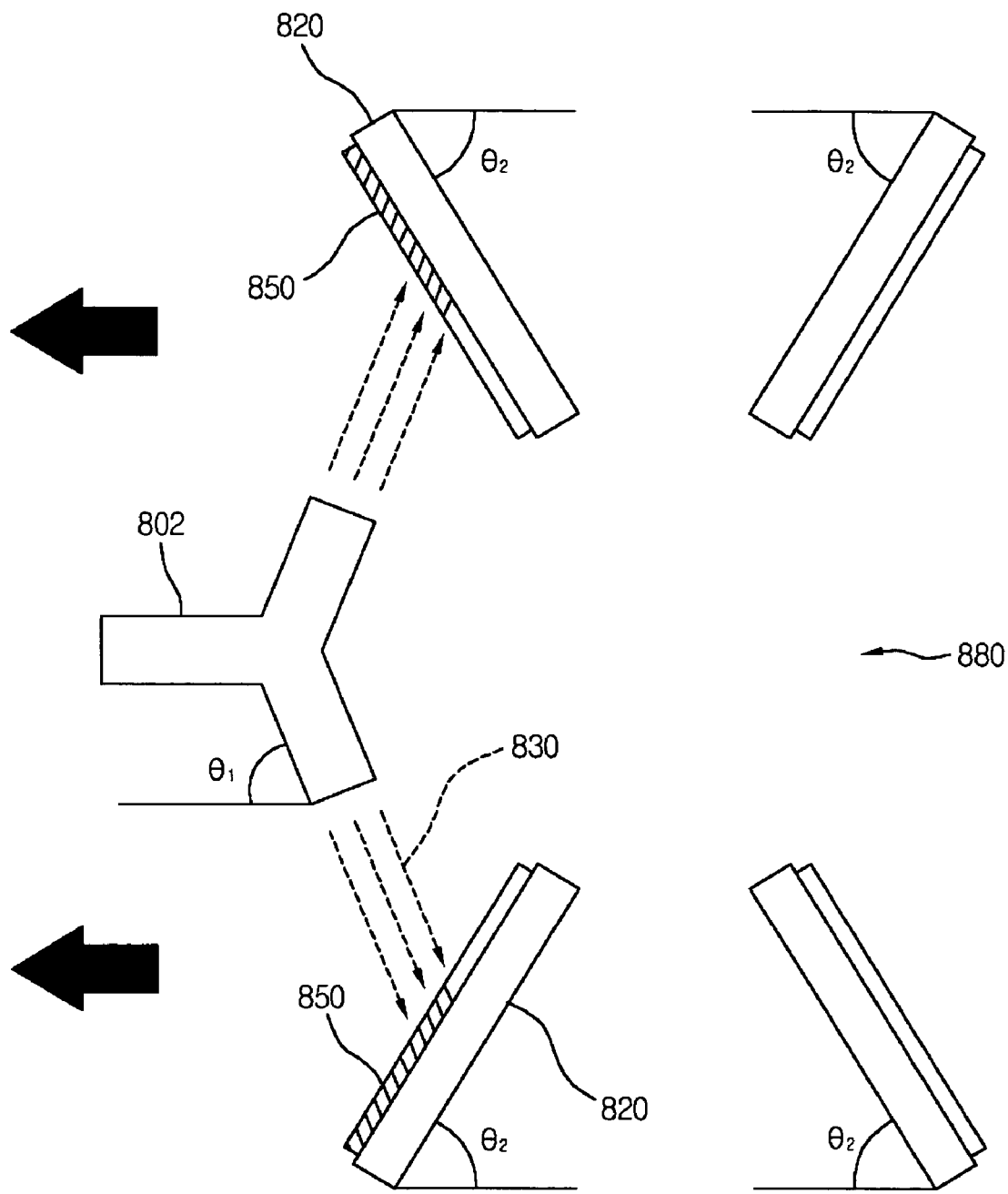
FIG. 13 is a schematic view of an ion beam irradiation device according to a sixth embodiment of the present invention.

FIG. 13 is a schematic view of an ion beam irradiation device according to a sixth embodiment of the present invention.

In the ion beam irradiation device 880 according to the sixth embodiment, the ion beam 830 irradiates the entire surface of each of substrates 820 as the substrates 820 move in one direction, as shown in FIG. 13.

The ion beam irradiation device 880 is similar to the ion beam irradiation device 780 of the previous embodiment. The ion beam irradiation device 880 includes an ion gun 802, which accelerates an ion beam 830 and extracts the accelerated ion beam onto the substrates 820. The ion gun 802 includes two ion beam irradiating outlet branches, which are inclined by a predetermined angle θ1 with respect to a moving direction of the substrates 820. Unlike the previous embodiment, θ1 is an oblique angle, not perpendicular.

The four substrates 820, which are mounted on a stage (not shown), are similar to the substrates 720 of the previous embodiment, with the exception that, because the outlet branches of the ion gun 802 are angled, the angle of the substrates 820 with respect to the moving direction (θ2) is greater to maintain the predetermined angle used to produce the desired amount of pre-tilt. Thus, similar to the previous embodiment, the substrates 820 are arranged in pairs of substrates which move in the moving direction with respect to the ion gun 802 disposed therebetween. The pairs of substrates 820 move such that the pairs of substrates 820 are inclined at a predetermined angle θ2 with respect to an axis parallel to the moving direction of the substrates 820 and are symmetric to a direction perpendicular to the moving direction of the substrates 820. Accordingly, as the substrates 820 move, the ion beams 830 irradiate the substrates 820, thereby aligning the alignment layers 850 formed on the substrates 820.

In other words, the substrates 820 are designed such that the two pairs of substrates 820 move in one direction in the vacuum chamber of the ion beam irradiation device 880 at a predetermined constant velocity. The ion beams 830 are extracted in both directions from both ion beam irradiating outlet branches of the ion gun 802 inclined by the predetermined angle θ1. Accordingly, the alignment layers 850 formed on the substrates 820 inclined by the predetermined angle θ2 with respect to the moving direction of the substrates 820 can be alignment-treated, thereby obtaining a desired pretilt angle.

To obtain a desired pretilt angle by irradiating an alignment layer using the ion beam of an ion beam irradiation device, proper process conditions should be set considering the sizes of the substrates coated with the alignment layers and the irradiation time of the ion beam. Accordingly, operations of ion beam irradiation devices reflecting proper process conditions will now be described.

Seventh Embodiment

Figure 14:
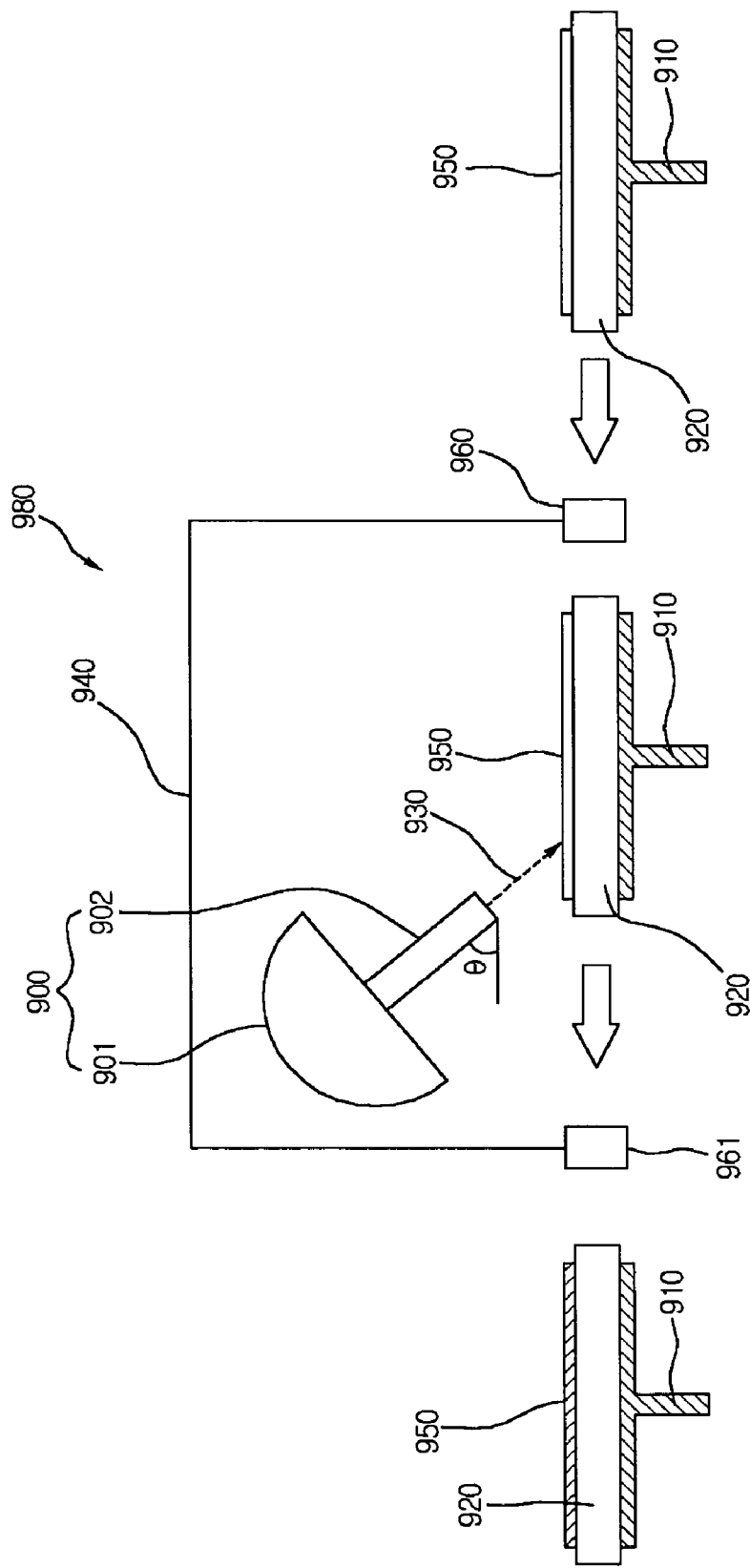
FIG. 14 is a schematic view of an ion beam irradiation device according to a seventh embodiment of the present invention.

FIG. 14 is a schematic view of an ion beam irradiation device according to a seventh embodiment of the present invention.

Referring to FIG. 14, the ion beam irradiation device 980 is designed such that an ion beam 930 can irradiate an entire surface of each substrate 920 as the substrates 920 move in one direction.

The ion beam irradiation device 980 includes an ion beam source 900 generating an ion beam 930 using a plasma forming part 901 and a bar-type ion gun 902, a vacuum chamber 940, a stage 910 on which the substrate 920 coated with the alignment layer 950 is mounted in the vacuum chamber 940 and moves the substrate 920 in one direction, and valves 960 and 961.

The ion gun 902 is installed such that it is inclined at an angle with respect to the substrate 920 when mounted on the stage 910. Accordingly, the ion beam 930 extracted from the ion gun 902 irradiates the substrate 920 at an inclination angle.

The stage 910 on which the substrate 920 is mounted is designed to move in one direction at a predetermined constant velocity within the irradiation area. Accordingly, the ion gun 902 irradiates the entire surface of the alignment layer 950 formed on the substrate 920 with the ion beam 930 extracted at the predetermined inclination angle θ to form a desired alignment direction in the alignment layer 950 and a desired pretilt angle.

To satisfy the alignment characteristics when aligning the alignment layer using ion beam irradiation, apparatus conditions such as the size of the ion gun 902, the size of the substrate 920, and the alignment time should be considered. Accordingly, process conditions considering the apparatus conditions will now be reviewed with reference to FIG. 15.

Figure 15:
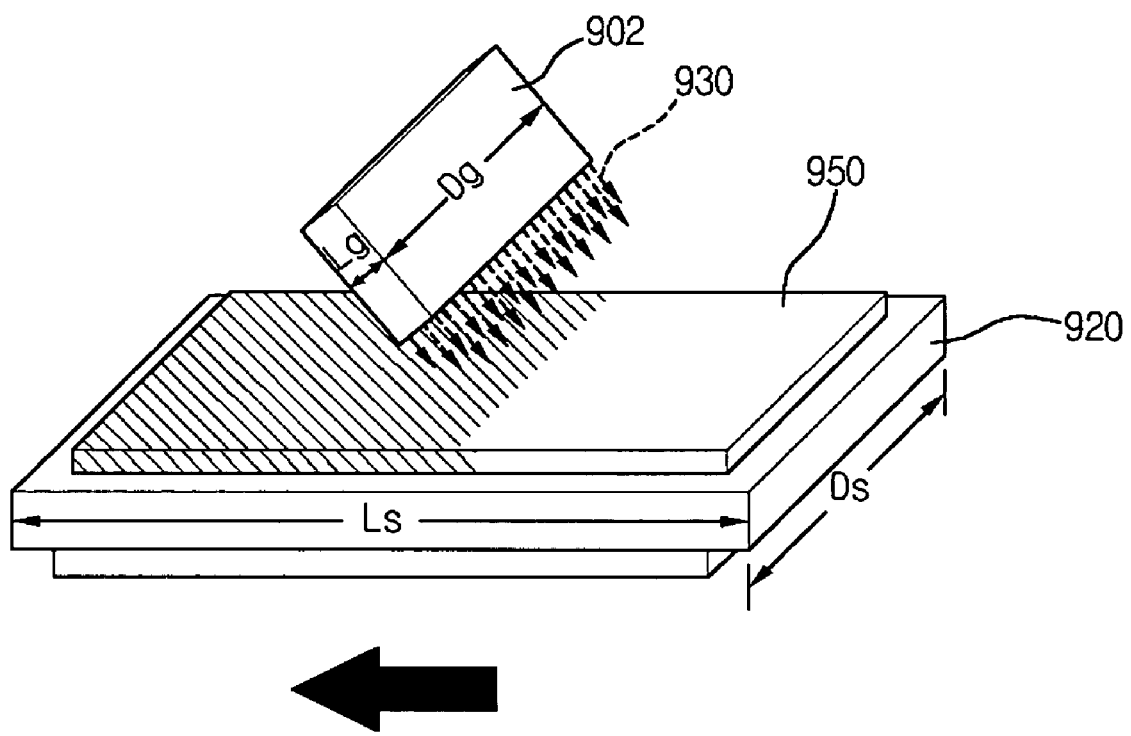
FIG. 15 is a schematic partial perspective view of the ion beam irradiation device of FIG. 14.

FIG. 15 is a schematic partial perspective view of the ion beam irradiation device of FIG. 14, and shows alignment of the alignment layer formed on a substrate using ion beam irradiation.

Referring to FIG. 15, the ion beam 930 is extracted with an inclination angle with respect to the substrate 920 from the bar-type ion gun 902, and then irradiates the alignment layer 950 formed on the substrate 920. The substrate 920 moves in one direction and accordingly, the entire surface of the alignment layer 950 formed on the substrate 920 is alignment-treated by the ion beam 930 extracted by the ion gun 902.

The number of ions injected onto the substrate 902 is called the 'dose'. To obtain the alignment characteristic, the alignment layer formed on the substrate 920 should have an ion beam dose ranging from $1.0 \times 10^{15}$ (EA/cm$^2$) to $1.0 \times 10^{17}$ (EA/cm$^2$).

When the ion beam dose is below $1.0 \times 10^{15}$ (EA/cm$^2$), the alignment characteristic of the alignment layer is not stable, and when the ion beam dose is above $1.0 \times 10^{17}$ (EA/cm$^2$), fracture of the surface of the alignment layer may occur.

Accordingly, the above ion beam dose range should be applied regardless of the method of ion beam irradiation.

In the ion beam irradiation device of the embodiments described herein, the apparatus condition for satisfying the alignment condition can be induced by the following:

First, an ion beam dose satisfying the alignment characteristic, the size of the substrate (length of long side and length of short side), a region in which the ion beam 930 is irradiated from the ion gun 902, i.e., the size of the ion beam irradiation outlet (the length of long side and the length of short side), and the process time taken in processing one substrate are considered.

As shown in FIG. 15, apparatus parameters are defined as follows:

I(A) is the current intensity;

Lg is the length of the short side of the ion beam irradiation outlet through which the ion beam is irradiated (which corresponds to a length (unit: cm) in the moving direction of the substrate);

Dg is the length of the long side of the ion beam irradiation outlet through which the ion beam is irradiated (which corresponds to a length (unit: cm) perpendicular to the moving direction of the substrate);

Ls is the length of the substrate in the moving direction;

Ds is the length of the substrate in a direction perpendicular to the moving direction.

T is the process time taken to process one substrate.

Regarding the ion beam dose, the process parameters are defined as follows:

Nd is the number of ions produced by the ion gun per unit area (cm$^2$) and unit time (sec);

Ng is the number (EA) of total ions produced by the ion gun during a moving time (T) of one substrate; and Ns is the number (EA) of total ions used during a moving time of one substrate.

The Nd, number of ions irradiated from the ion gun per unit area (cm$^2$) and unit time (sec), is related to the current intensity (I) of the ion beam and charge (Qi) of each ion as follows:

$$Nd = I/Qi,$$

where Qi is $1.6 \times 10^{-19}$ (C).

Accordingly, Nd can be expressed by below:

$$Nd = I \times 6.25 \times 10^{18} \ (EA/cm^2 \ast sec).$$

Also, Ng, the number (EA) of total ions produced by the ion gun during a moving time (T) of one substrate, is related to the area (Lg×Dg) (cm$^2$) of the ion beam irradiation outlet, which can be expressed as below:

$$Ng = Nd \times T \times Lg \times Dg = I \times T \times Lg \times Dg \times 6.25 \times 10^{18} \ (EA) \quad (1).$$

Also, to satisfy the alignment characteristic, Ns, namely, the number of total ions, should satisfy an irradiation condition of ion beam per unit area.

As mentioned, to obtain the alignment characteristic, the alignment layer should satisfy the ion beam irradiation condition ranging from $1.0 \times 10^{15}$ (EA/cm$^2$) to $1.0 \times 10^{17}$ (EA/cm$^2$).

Accordingly, Ns, namely, the number of ions used during the moving time (T) of one substrate, should satisfy the following relation:

$$Ls \times Ds \times 1.0 \times 10^{15} \ (EA) \leq Ns \leq Ls \times Ds \times 1.0 \times 10^{17} \ (EA) \quad (2).$$

In the above equations (1) and (2), Ng, the number (EA) of total ions produced by the ion gun during a moving time (T) of one substrate, should be basically equal to Ns, the number of total ions, should satisfy an irradiation condition of ion beam per unit area. Accordingly, Ng and Ns have a relation expressed by below:

$$Ls \times Ds \times 1.0 \times 10^{15} \ (EA) \leq I \times T \times Lg \times Dg \times 6.25 \times 10^{18} \leq Ls \times Ds \times 1.0 \times 10^{17} \ (EA)$$

Since Dg, the length perpendicular to the moving direction of the substrate, is equal to Ds, the effective length of ion beam irradiation, Dg can be replaced by Ds.

Accordingly, $$Ls \times Ds \times 1.0 \times 10^{15} \leq I \times T \times Lg \times Ds \times 6.25 \times 10^{18} \leq Ls \times Ds \times 1.0 \times 10^{17},$$

finally, the above relation can be expressed as below:

$$1.6 \times 10^{-4} \leq (Lg \times I \times T)/Ls \leq 1.6 \times 10^{-2} \quad (3).$$

In other words, when the alignment layer formed on the substrate is alignment-treated by the bar-type ion beam irradiation device, the ion beam irradiation device should be designed so as to satisfy the relation (3) such that the alignment layer can satisfy the alignment characteristic.

Eighth Embodiment

Figure 16:
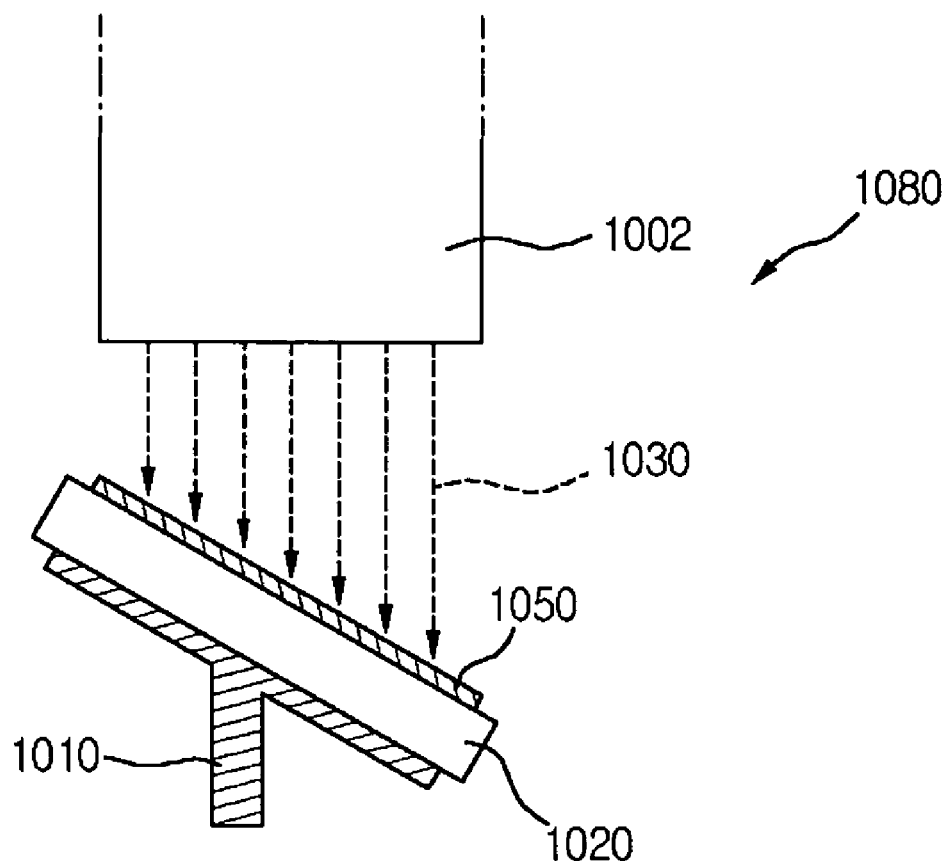
FIGS. 16 and 17 are schematic views illustrating an ion beam irradiation device according to an eighth embodiment of the present invention.
Figure 17:
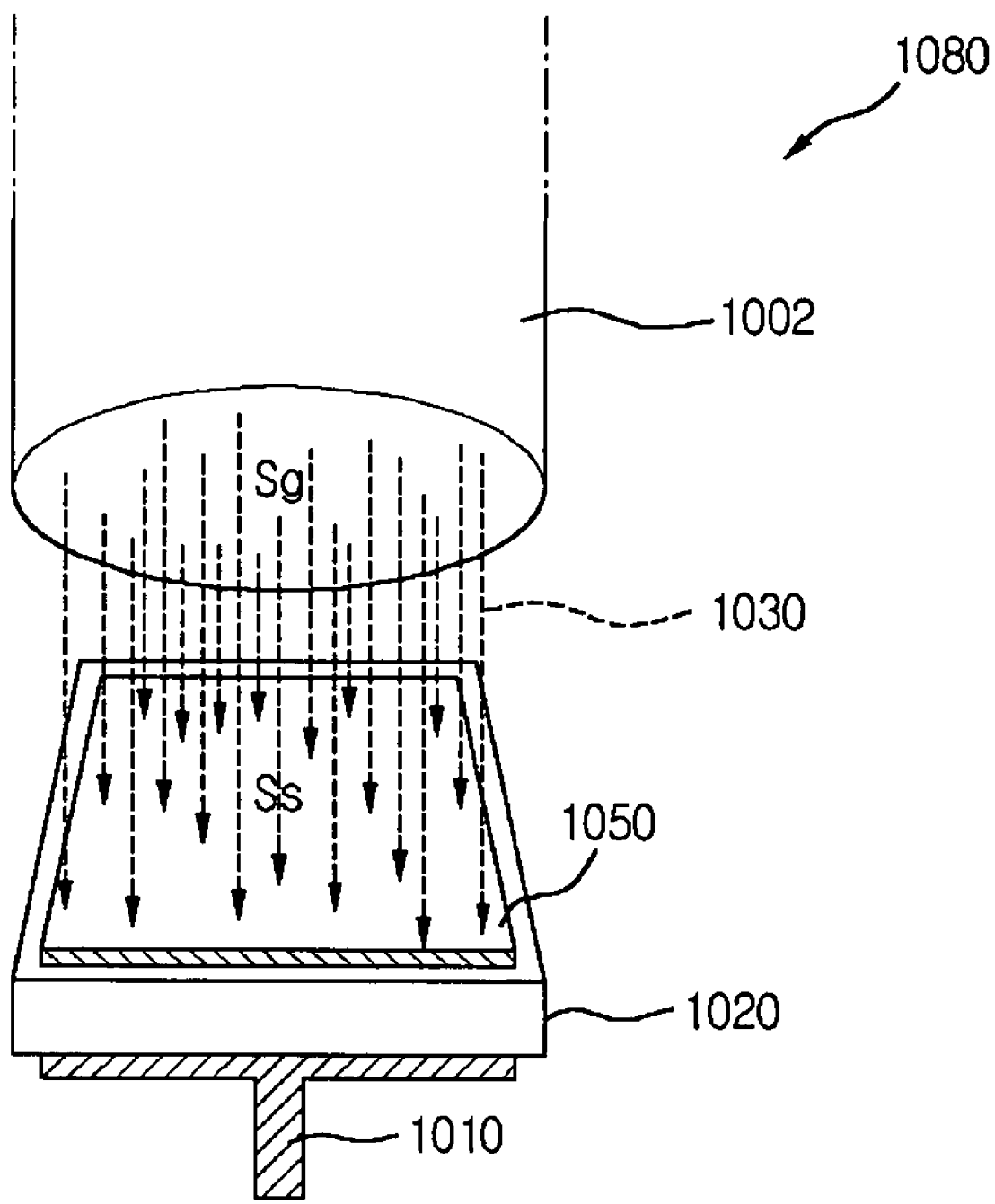

FIGS. 16 and 17 are schematic views illustrating an ion beam irradiation device according to an eighth embodiment of the present invention. As shown in FIGS. 16 and 17, an ion gun 1002 employed in the ion beam irradiation device 1080 is cylinder shaped. Also, in this embodiment, the substrate 1020 is not moved but is fixed, and the ion beam 1030 irradiates the entire area of the substrate 1020.

Specifically, FIG. 16 is a sectional view illustrating alignment of the alignment layer formed on the substrate 1020 in the ion beam irradiation device 1080, and FIG. 17 is a perspective view illustrating an alignment process of the alignment layer using the ion beam irradiation device 1080.

Referring to FIGS. 16 and 17, the ion gun 1002 is cylinder shaped. The ion gun 1002 has an outlet area that is equal to or greater than an area Ss of the substrate 1020 such that the ion beam 1030 irradiates the entire area of the substrate 1020.

In the above construction, the substrate 1020 is inclined at an angle with respect to an irradiation direction of the ion beam 1030 extracted from the ion gun 1002, and is mounted on a stage 1010. An alignment layer 1050 is formed on the entire surface of the substrate 1020.

From the above construction, equation 4 can be obtained in contrast with the equation 1 described in the seventh embodiment:

$$Ng = Nd \times T \times Lg \times Dg = I \times T \times Sg \times 6.25 \times 10^{18} \, (EA) \quad (4).$$

Also, equation 5 can be obtained in contrast with the equation 2 described in the seventh embodiment:

$$Ss \times 1.0 \times 10^{15} \, (EA) \leq Ns \leq Ss \times 1.0 \times 10^{17} \, (EA) \quad (5).$$

In the above equation 4, it is noted that parameter T represents an ion beam irradiation time on the substrate. Since Ng, the number (EA) of total ions irradiated from the ion gun during the time (T), equations 6 and 7 can be obtained as below:

$$Ss \times 1.0 \times 10^{15} \leq I \times T \times Sg \times 6.25 \times 10^{18} \leq Ss \times 1.0 \times 10^{17} \quad (6).$$

$$1.6 \times 10^{-4} \leq I \times T \times Sg/Ss \leq 1.6 \times 10^{-2} \quad (7).$$

In other words, when the alignment layer 1050 formed on the substrate 1020 is alignment-treated by the ion gun 1002 of the ion beam irradiation device 1080 having area Sg, the ion beam irradiation device should be designed so as to satisfy the equations of (6) and (7) such that the alignment layer 1050 can satisfy the alignment characteristic.

Thus, by using the ion beam irradiation device shown in the figures, the uniformity of the alignment layer can be maintained and alignment of the alignment layers can be performed using a single irradiation by the ion beam, resulting in increased productivity.

In each embodiment, although the stage has been described as moving through the vacuum chamber, the ion source can move and the stage remain fixed or both may move. In addition, the substrates may be mounted on the stage at the desired angle with respect to the ion source or may be mounted perpendicular to the ion source and moved into the desired angular position only after being introduced to the vacuum chamber. Similarly, each ion beam irradiation device may include a shutter between the ion beam source and the substrate, and/or a mask for controlling the ion beam dose on the substrate.

Other configurations having multiple substrates are also possible. For example the arrangements disclosed herein may be duplicated such that, say, in the embodiment of FIG. 5 pairs of substrates are arranged parallel to the moving direction of the stage, arranged parallel to the plane of the substrates (i.e. adding pairs of substrates essentially continuing from the lower edges of the substrates to look like an extended V), or adding additional substrates at the edges of the substrates and at the same angles θ, but mirror imaged around the direction perpendicular to the moving direction (to look like a W). A somewhat larger ion beam would be used to simultaneously irradiate the substrates in the latter two cases. In other alternative embodiments, the stage and/or ion gun is movable relative to each other. In these embodiments, the stage, ion gun or a combination may be movable just as the substrates may be movable. Further, arrangements that use triangular (or other shapes) layouts with different numbers of substrates may be used if the arrangements are substantially symmetric.

Note that some known features of the arrangements that are present have not been shown or described for brevity. For example, motors to move the stage, a track along which the stage moves through the vacuum chamber, various other ports of the vacuum chamber as well as pumps used to create the vacuum in the vacuum chamber are all known and thus have not been discussed.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An ion beam irradiation device comprising:
a vacuum chamber;
a stage adapted to mount at least two substrates such that the substrates are disposed in the vacuum chamber; and
an ion gun provided in the vacuum chamber from which an ion beam is emitted;
wherein at least one of the stage and ion gun is movable relative to each other, an oblique angle is defined by the ion beam and the substrates being irradiated, and the ion gun and at least a plurality of the substrates are arranged such that the ion beam irradiates the plurality of the substrates simultaneously.

2. The ion beam irradiation device of claim 1, wherein the at least two substrates are movable relative to the ion gun.

3. The ion beam irradiation device of claim 1, wherein the stage is movable within the vacuum chamber.

4. The ion beam irradiation device of claim 1, wherein the ion gun is movable.

5. The ion beam irradiation device of claim 1, wherein the at least two substrates and the ion gun are movable within the vacuum chamber.

6. The ion beam irradiation device of claim 1, wherein the stage and the ion gun are movable within the vacuum chamber.

7. The ion beam irradiation device of claim 1, further comprising substrates mounted on the stage, the substrates having alignment layers.

8. The ion beam irradiation device of claim 1, wherein the stage is adapted to mount the substrates such that the substrates are arranged in parallel to a moving direction and are disposed with an inclination angle to the moving direction.

9. The ion beam irradiation device of claim 1, wherein the stage is adapted to mount the substrates such that the substrates are arranged in series to a moving direction and are disposed with an inclination angle to an axis perpendicular to the moving direction.

10. The ion beam irradiation device of claim 1, wherein the stage is adapted to mount the substrates such that the substrates comprise first substrates, which are arranged in parallel to a moving direction and are disposed with an inclination angle to the moving direction, and second substrates, which are arranged in series to the moving direction and are disposed with an inclination angle to an axis perpendicular to the moving direction.

11. The ion beam irradiation device of claim 1, wherein the ion gun is a bar-type ion gun.

12. The ion beam irradiation device of claim 1, wherein the ion gun is disposed such that the ion beam is emitted substantially perpendicular to a moving direction of the stage.

13. A method of operating an ion beam irradiation device, the method comprising:
arranging at least two substrates in a vacuum chamber such that the substrates are inclined at an angle with respect to a horizontal plane; and
irradiating an ion beam onto the substrates while the substrates are moving such that at least a plurality of the substrates are irradiated simultaneously by the ion beam.

14. The method of claim 13, wherein each of the substrates has an alignment layer formed on a surface thereof.

15. The method of claim 13, wherein the substrates are arranged in parallel to a moving direction and are disposed with an inclination angle to the moving direction.

16. The method of claim 13, wherein the substrates are arranged in series to a moving direction and are disposed with an inclination angle to an axis substantially perpendicular to the moving direction.

17. The method of claim 13, wherein the substrates comprise first substrates, which are arranged in parallel to a moving direction and are disposed with an inclination angle to the moving direction, and second substrates, which are arranged in series to the moving direction and are disposed with an inclination angle to an axis substantially perpendicular to the moving direction.

18. The method of claim 13, wherein the ion gun is a bar-type ion gun.

19. The method of claim 13, wherein the ion beam travels substantially perpendicular to the horizontal plane.

20. An ion beam irradiation device comprising:
a vacuum chamber;
a movable stage adapted to mount at least two substrates such that the substrates are disposed in the vacuum chamber parallel to each other; and
an ion gun provided between portions of the stage in which the substrates are to be mounted, with the ion gun having ion beam irradiation outlet branches inclined at at least two different angles with respect to the portions of the stage.

21. The ion beam irradiation device of claim 20, wherein the ion gun is a bar-type ion gun.

22. The ion beam irradiation device of claim 20, further comprising substrates mounted on the stage, the substrates having alignment layers.

23. A method of operating an ion beam irradiation device, the method comprising:
arranging at least two substrates in a vacuum chamber such that the substrates are arranged in parallel with and facing each other; and
irradiating an ion beam from an ion gun onto the substrates while the substrates are moving in one direction, the ion gun being provided between the substrates with ion beam irradiation outlet branches inclined at at least two different angles with respect to a face parallel to the substrates.

24. The method of claim 23, wherein each of the substrates has an alignment layer formed on a surface thereof.

25. An ion beam irradiation device comprising:
a vacuum chamber;
a movable stage adapted to mount at least two substrates such that the substrates are disposed in the vacuum chamber with an inclination angle to a vertical plane of the vacuum chamber; and
an ion gun provided in the vacuum chamber from which an ion beam is emitted, and at least a plurality of the substrates are arranged such that the ion beam irradiates the plurality of the substrates simultaneously.

26. The ion beam irradiation device of claim 25, further comprising substrates mounted on the stage, the substrates having alignment layers.

27. The ion beam irradiation device of claim 25, wherein the ion gun comprises ion beam irradiation outlet branches through which the ion beam is emitted, the ion beam irradiation outlet branches being formed in directions substantially perpendicular to the vertical plane.

28. The ion beam irradiation device of claim 25, wherein the ion gun comprises ion beam irradiation outlet branches through which the ion beam is emitted, the ion beam irradiation outlet branches being formed in directions that form an oblique angle with the vertical plane.

29. The ion beam irradiation device of claim 28, wherein an angle between the ion beam irradiation outlet branches and the vertical plane is different than an angle between the stage and the vertical plane.

30. A method of operating an ion beam irradiation device, the method comprising:
arranging at least two substrates in a vacuum chamber such that the substrates are inclined at an angle with respect to a vertical plane; and
irradiating the substrates with ion beams from an ion gun while the substrates are moving in one direction, the ion gun being provided between the substrates and providing the ion beams in multiple directions.

31. The method of claim 30, wherein each of the substrates has an alignment layer formed on a surface thereof.

32. The method of claim 30, wherein the ion gun emits the ion beam in directions substantially perpendicular to the vertical plane.

33. The ion beam irradiation device of claim 30, wherein the ion gun emits the ion beam in directions that form an oblique angle with the vertical plane.

34. The ion beam irradiation device of claim 30, wherein an angle at which the ion beam is emitted is different than an angle between the substrates and the vertical plane.

35. A method of operating an ion beam irradiation device comprising a vacuum chamber; a substrate disposed in the vacuum chamber and moving in one direction; and an ion gun irradiating the substrate with an ion beam, the method comprising:
providing an ion beam from the ion gun that satisfies $1.6 \times 10^{-4} \leq (Lg \times I \times T)/Ls \leq 1.6 \times 10^{-2}$ where I is a current intensity of the ion beam, T is an irradiation time on the substrate, Lg is a length of a short side of an ion beam irradiation outlet, and Ls is a length of the substrate in the moving direction the numerical quantities having each a unit of EA/cm$^2$.

36. The method of claim 35, wherein the ion gun is a bar-type ion gun.

37. A method of operating an ion beam irradiation device comprising a vacuum chamber; a substrate fixed in the vacuum chamber; and an ion gun irradiating the substrate with an ion beam, the method comprising:
controlling a process condition such that the ion beam of the ion gun satisfies $1.6 \times 10^{-4} \leq I \times T \times Sg/Ss \leq 1.6 \times 10^{-2}$ where I is a current intensity of the ion beam, T is an irradiation time on the substrate, Sg is an area of the ion beam emitted from the ion gun, and Ss is an area of the substrate the numerical quantities having each a unit of EA/cm$^2$.

38. A method of operating an ion beam irradiation device comprising a vacuum chamber; a substrate fixed in the vacuum chamber; and an ion gun irradiating the substrate with an ion beam, the method comprising:
controlling a process condition such that dose of the ion beam is between $1.0 \times 10^{15}$(EA/cm$^2$) and $1.0 \times 10^{17}$(EA/cm$^2$).

39. The ion beam irradiation device of claim 1, wherein the substrates are orientated with respect to each other at twice the oblique angle.

40. The ion beam irradiation device of claim 1, wherein the ion gun and the substrates are disposed such that the ion beam irradiates substantially an entire width of a portion of each of the substrates being irradiated, the portion being less than a length of the substrates being irradiated in a moving direction.

41. The method of claim 13, wherein the substrates are orientated with respect to each other at twice the oblique angle.

42. The method of claim 13, wherein the ion gun and the substrates are disposed such that the ion beam irradiates substantially an entire width of a portion of each of the substrates being irradiated, the portion being less than a length of the substrates being irradiated in a moving direction.

43. The ion beam irradiation device of claim 25, wherein the substrates are orientated with respect to each other at twice the oblique angle.

44. The ion beam irradiation device of claim 25, wherein the ion gun and the substrates are disposed such that the ion beam irradiates substantially an entire width of a portion of each of the substrates being irradiated, the portion being less than a length of the substrates being irradiated in a moving direction.

45. The ion beam irradiation device of claim 20, wherein the ion beam irradiation outlet branches provide ion beams in different directions from each other.

46. The method of claim 23, wherein the ion beam irradiation outlet branches provide ion beams in different directions from each other.

47. The method of claim 30, wherein providing the ion beams in multiple directions comprises providing separate sets of ion beams in different directions from each other.

48. The ion beam irradiation device of claim 1, wherein all of the substrates mounted on the stage are irradiated in a single pass of the ion beam.

49. The method of claim 13, wherein all of the substrates mounted on the stage are irradiated in a single pass of the ion beam.

50. The ion beam irradiation device of claim 20, wherein all of the substrates mounted on the stage are irradiated in a single pass of the ion beam.

51. The method of claim 23, wherein all of the substrates mounted on the stage are irradiated in a single pass of the ion beam.

52. The ion beam irradiation device of claim 25, wherein all of the substrates mounted on the stage are irradiated in a single pass of the ion beam.

53. The method of claim 30, wherein all of the substrates mounted on the stage are irradiated in a single pass of the ion beam.

* * * * *

UNITED STATES PATENT AND TRADEMARK OFFICE
CERTIFICATE OF CORRECTION

PATENT NO.    : 6,967,340 B2                                             Page 1 of 1
DATED         : November 22, 2005
INVENTOR(S)   : Yun Bok Lee et al.

It is certified that error appears in the above-identified patent and that said Letters Patent is hereby corrected as shown below:

Column 17,
Line 4, after "moving direction" insert -- , -- (comma).
Line 17, after "substrate" insert -- , -- (comma).

Signed and Sealed this

Seventh Day of February, 2006

JON W. DUDAS
*Director of the United States Patent and Trademark Office*